United States Patent
Okuda et al.

(10) Patent No.: US 7,293,352 B2
(45) Date of Patent: Nov. 13, 2007

(54) ORIGIN DETECTION METHOD FOR COMPONENT PLACEMENT HEAD

(75) Inventors: Osamu Okuda, Nakakoma-gun (JP); Kazuo Kido, Kofu (JP); Hideki Uchida, Nakakoma-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 186 days.

(21) Appl. No.: 10/526,894

(22) PCT Filed: Sep. 11, 2003

(86) PCT No.: PCT/JP03/11602

§ 371 (c)(1),
(2), (4) Date: Mar. 4, 2005

(87) PCT Pub. No.: WO2004/026016

PCT Pub. Date: Mar. 25, 2004

(65) Prior Publication Data

US 2006/0005379 A1    Jan. 12, 2006

(30) Foreign Application Priority Data

Sep. 13, 2002 (JP) .............................. 2002-267950
Sep. 13, 2002 (JP) .............................. 2002-268010
Jul. 22, 2003 (JP) .............................. 2003-277293

(51) Int. Cl.
*B23P 19/00* (2006.01)
*A47J 45/00* (2006.01)

(52) U.S. Cl. ........................... 29/743; 29/739; 29/740; 29/741; 294/64.1

(58) Field of Classification Search .................. 29/832, 29/834, 739, 740, 741, 743, 757, 833, 742; 294/164, 165, 167, 64.1; 74/840; 384/67, 384/98; 382/148, 151
See application file for complete search history.

(56) References Cited

U.S. PATENT DOCUMENTS

| | | | | |
|---|---|---|---|---|
| 5,491,888 A | * | 2/1996 | Sakurai et al. ................. | 29/832 |
| 6,027,019 A | * | 2/2000 | Kou ........................... | 235/375 |
| 6,115,908 A | * | 9/2000 | Inaba et al. ................... | 29/741 |
| 6,342,916 B1 | * | 1/2002 | Kashiwagi et al. ........... | 348/87 |
| 2002/0050060 A1 | | 5/2002 | Okuda et al. | |

FOREIGN PATENT DOCUMENTS

| | | |
|---|---|---|
| EP | 1 195 232 | 4/2002 |
| JP | 62-236655 | 10/1987 |
| JP | 2000-40900 | 2/2000 |

* cited by examiner

*Primary Examiner*—A. Dexter Tugbang
*Assistant Examiner*—Tai V Nguyen
(74) *Attorney, Agent, or Firm*—Wenderoth, Lind & Ponack, L.L.P.

(57) ABSTRACT

An origin detection method for a component placement head includes setting an axial origin for each elevation nut section, of the component placement head, by detecting a rotational angle of a drive section corresponding to the elevation nut section. The elevation nut sections are then individually moved down from the axial origin so that light emitted from a light-projecting section is received by a light-receiving section without being interrupted. Then, it is confirmed that the axial origin of each elevation nut section is an origin of elevation by detecting interruption of light, emitted from the light-projecting section, by the elevation nut section at a position corresponding to the elevation nut section having been lowered from the axial origin by a prescribed light interruption dimension.

4 Claims, 14 Drawing Sheets

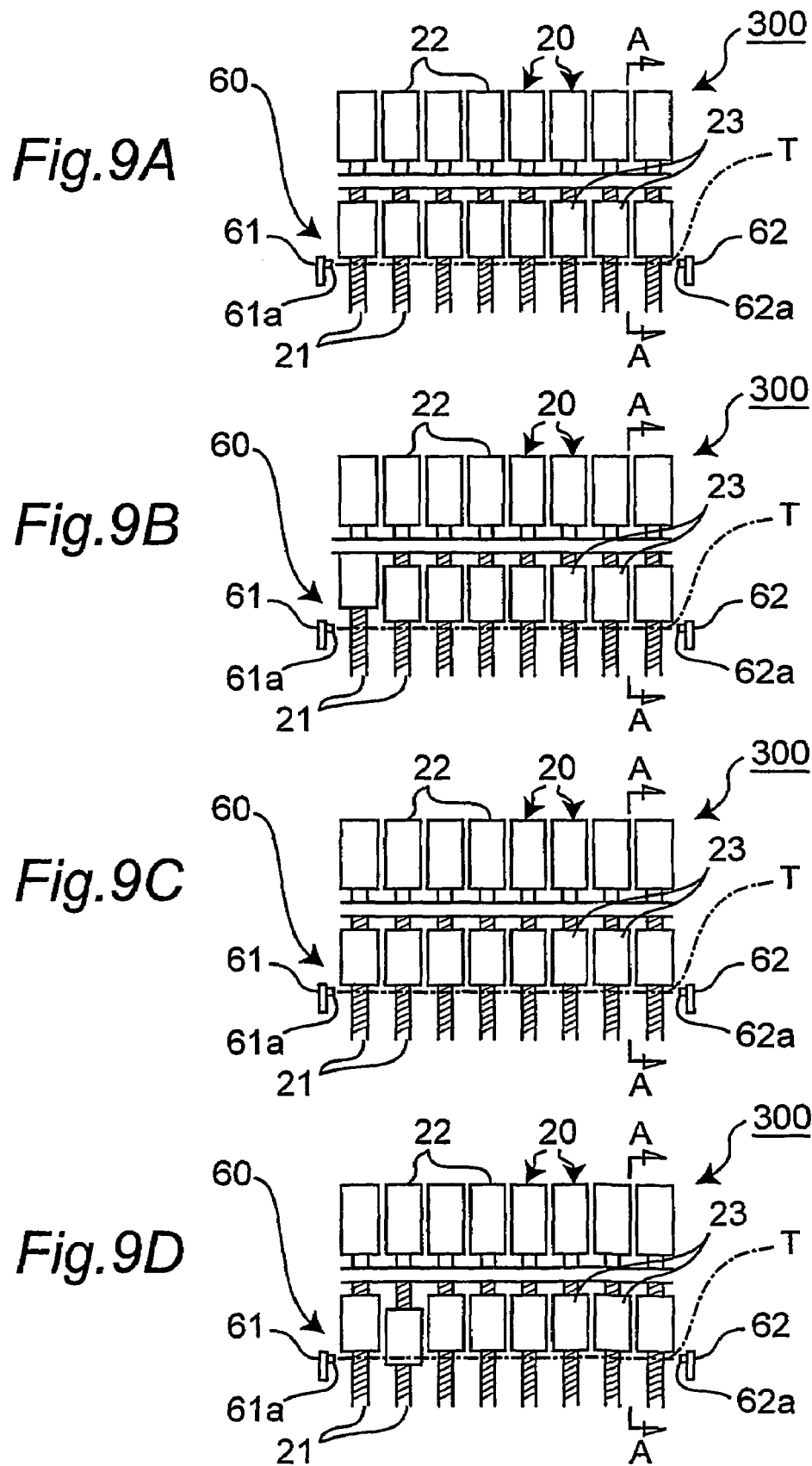

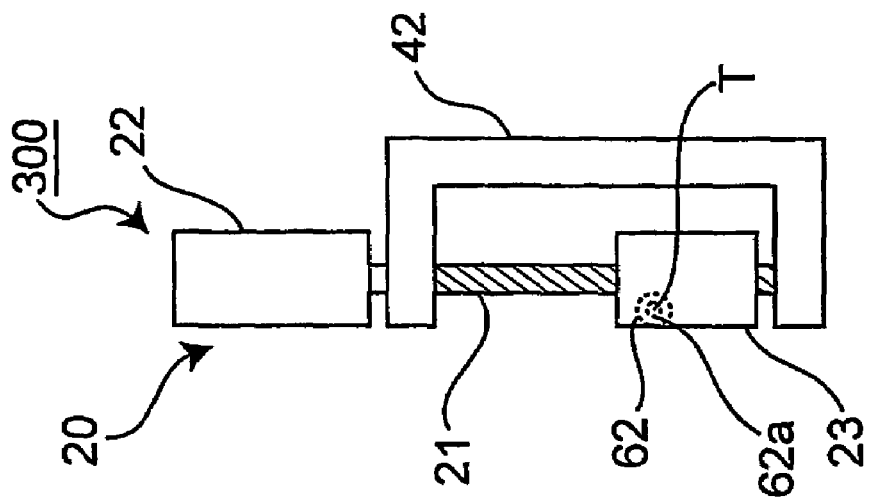
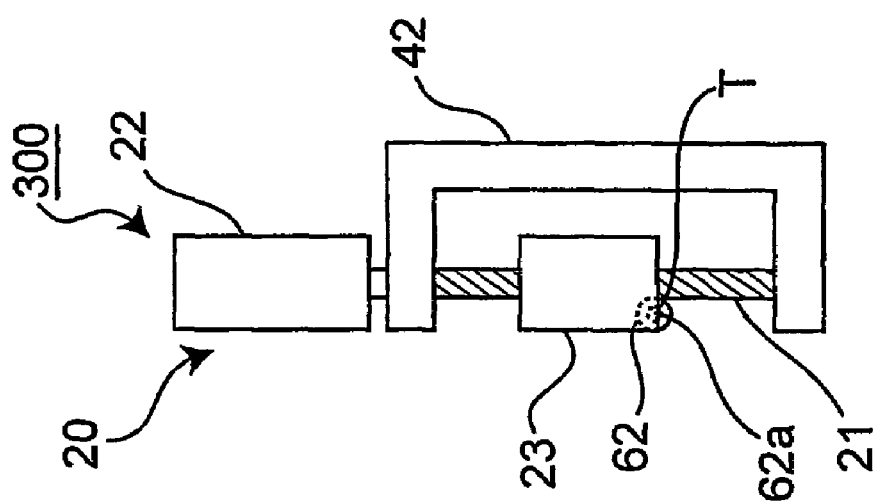
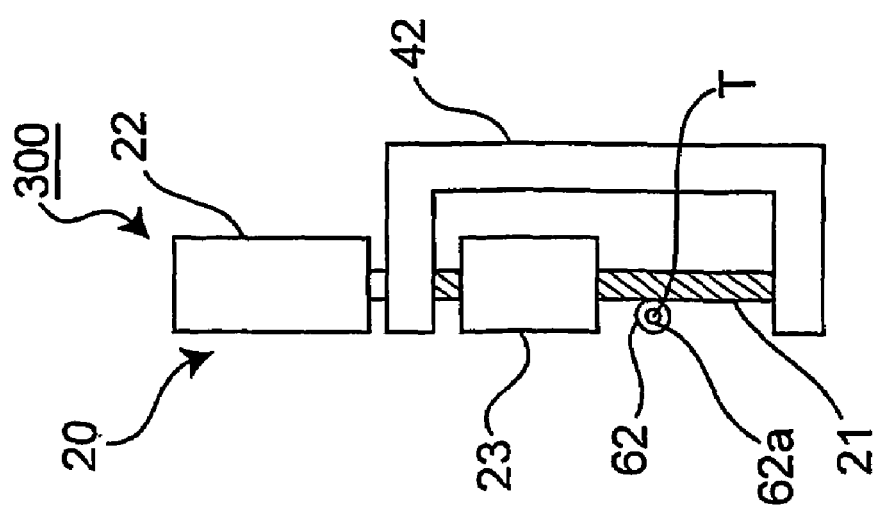

ORIGIN DETECTION METHOD FOR COMPONENT PLACEMENT HEAD

TECHNICAL FIELD

The present invention relates to a component placement head for holding a plurality of components by a plurality of component holding members and mounting the components onto a circuit board, and to an origin detection method for an elevating operation of the component holding members.

BACKGROUND ART

In recent years, the electronic equipment market has earnestly demanded downsizing and functional improvement of various electronic equipment with built-in component-mounted boards formed by placing and mounting a plurality of electronic components onto a circuit board. Therefore, it is required to perform high-density mounting (or placement) and high-accuracy mounting (or placement) of electronic components in forming a component-mounted board. It is further demanded to reduce a production cost of component-mounted boards. For example, it is additionally demanded to improve productivity per unit area of component-mounted boards, i.e., productivity per unit area in mounting electronic components.

Such a component-mounted board is manufactured by placing a plurality of electronic components onto a circuit board, and thereafter heating the circuit board on which the electronic components are placed in a reflow manner for mounting of the electronic components placed on the circuit board. Such a manufacturing process is called a component mounting process (or component-mounted board production process), which is categorized roughly into a component placement process and a reflow process. The component placement process is performed by an electronic component placement apparatus provided with a component placement head that sucks and holds a plurality of electronic components and places them onto a circuit board.

FIG. 4 shows a sectional view of a head section 500 that is one example of a component placement head employed in such a conventional electronic component placement apparatus (refer to, for example, Japanese unexamined Patent Publication No. 2000-40900), and structure of the head section 500 will be described with reference to FIG. 4.

As shown in FIG. 4, the head section 500 is provided with a suction nozzle 502 that is one example of a component holding member for releasably holding an electronic component 501 such as a chip component, a shaft section 510 that is one example of a shaft section detachably equipped with this suction nozzle 502, an elevation unit 520 for moving up and down the suction nozzle 502 equipped for the shaft section 510 via this shaft section 510, and a rotating unit 530 for rotating the suction nozzle 502 around its axis of rotation (its axial center of rotation) via the shaft section 510.

Moreover, in order to improve efficiency of an operation of placing electronic components 501 onto a circuit board by providing the head section 500 with a plurality of suction nozzles 502 capable of individually sucking and holding electronic components 501, the head section 500 is provided with, for example, eight sets of shaft sections 510 and elevation units 520, and the shaft sections 510 and the elevation units 520 are supported by a head frame 540 of the head section 500 so that the shaft sections 510 are arranged in a line (i.e., the suction nozzles 502 are arranged in a line). Moreover, the rotating unit 530 is able to rotate four suction nozzles 502 equipped for four mutually adjacent shaft sections 510. In the head section 500 capable of being equipped with eight suction nozzles 502, two rotating units 530 are provided while being supported by the head frame 540, by which the suction nozzles 502 equipped for the shaft sections 510 are made rotatable.

With regard to the head section 500 having the above-mentioned construction, a detailed structure of the shaft section 510 will be described first. As shown in FIG. 4, each shaft section 510 is provided with a spline shaft 511 that has a nozzle attaching portion 511a, which is one example of a holding member attaching portion capable of being detachably equipped with the suction nozzle 502, at its end portion (lower end in this figure). Moreover, the spline shaft 511 is able to rotate around its axis of rotation P by the rotating unit 530 corresponding to this shaft section 510, and elevatable along axis of rotation P by a corresponding elevation unit 520. In the shaft sections 510, spline shafts 511 are elevatable and rotatable as described above while being supported as the shaft sections 510 by the head frame 540. This support structure will be described by using a partially enlarged schematic view of the shaft section 510 shown in FIG. 5.

As shown in FIG. 5, the shaft section 510 is further provided with a first spline nut 512 (arranged on an upper side in this figure) and a second spline nut 513 (arranged on a lower side in the figure), which are arranged apart from each other along axis of rotation P of the spline shaft 511, and which are two spline nuts that elevatably support the spline shaft 511.

Moreover, as shown in FIG. 5, the first spline nut 512 and the second spline nut 513 are supported via a bearing section 514 and a bearing section 515, respectively, to a shaft frame 541 rotatably around axis of rotation P together with the spline shaft 511 on an inner periphery of the shaft frame 541, that has a roughly cylindrical shape, in the head frame 540. Moreover, a roughly cylindrical outer cylinder collar 516 has its inner peripheral surface bonded to an outer periphery of the first spline nut 512, and an outer periphery of the outer cylindrical collar 516 is further rotatably supported on an inner periphery of the shaft frame 541 via another bearing section 517, rotatably supporting the first spline nut 512. Moreover, an outer cylindrical collar 518 is similarly bonded to the second spline nut 513 and rotatably supported via another bearing section 519.

With the shaft section 510 having the above-mentioned structure, the spline shaft 511 is elevatable along axis of rotation P on the inner periphery of the first spline nut 512 and the second spline nut 513 in the shaft section 510, and both the first spline nut 512 and the second spline nut 513 are made rotatable around axis of rotation P on the inner periphery of the shaft frame 541.

Detailed structure of the rotating unit 530 will be described next. As shown in FIG. 4, the rotating unit 530 is provided with a shaft gear 531 arranged so that the spline shaft 511 penetrates a cylindrical inner portion thereof. Moreover, the shaft gear 531 rotates the first spline nut 512 by rotation around axis of rotation P thereof, thereby allowing the spline shaft 511 to be rotated. Further, the rotating unit 530 is provided with a cogged belt 532 engaged with the shaft gear 531, a driving gear 533 engaged with the cogged belt 532, and a rotating drive motor 534 at an end of its driving shaft 534a to which the driving gear 533 is fixed and which is able to rotate the driving shaft 534a in either a forward or reverse direction.

Moreover, as shown in FIG. 5, the shaft gear 531 has its lower end connected to an upper end portion 516a, in this figure, of an outer cylindrical collar 516 bonded to the first spline nut 512 via a ring-shaped coupling 535. Moreover, the shaft gear 531 is supported on an inner peripheral surface of the shaft frame 541 so as to be rotatable around axis of rotation P via two bearing sections 536 at an upper end and a lower end of its outer peripheral surface, and so as not to come into contact with the spline shaft 511. Moreover, a plurality of teeth are continuously provided on an outer peripheral surface of the shaft gear 531, an inner peripheral surface of the cogged belt 532 and an outer peripheral surface of the driving gear 533, in order to strengthen mutual engagement.

In this case, relations of planes among the shaft gear 531, the cogged belt 532 and the driving gear 533 will be described here with reference to a schematic explanatory view shown in FIG. 6. As shown in FIG. 6, one driving gear 533 and four mutually adjacent shaft gears 531 are engaged with one another inside one cogged belt 532. That is, by rotatively driving the driving gear 533 in either the forward or reverse direction by the rotating drive motor 534, the cogged belt 532 is driven to run in a rotational drive direction, thereby allowing the four shaft gears 531 to be concurrently rotated in the rotational drive direction. Moreover, between the shaft gears 531 and between the shaft gear 531 located at the left-hand end in this figure and the driving gear 533, four tension rollers 537 are provided so as to consistently inwardly urge the cogged belt 532, thereby consistently applying a constant tension to the cogged belt 532 and maintaining a satisfactory engagement relationship among the gears.

With the rotating unit 530 having the above-mentioned structure, the spline shafts 511 corresponding to the four shaft gears 531 can be rotated around axis of rotation P concurrently in the same rotational direction via the coupling 535 and the first spline nut 512.

The elevation unit 520 will be described next. As shown in FIG. 4, the elevation unit 520 is provided with a ball screw shaft 521 supported, by an elevation frame 542 of the head frame 540, rotatably around axis of rotation Q (an axial center of rotation) thereof arranged roughly parallel to axis of rotation P of the spline shaft 511. The elevation unit 520 is further provided with an elevation drive motor 522, which is fixed to an upper end portion, in this figure, of the ball screw shaft 521 and rotates the ball screw shaft 521 in either a forward or reverse direction around axis of rotation Q, and an elevation nut section 523, which is meshed with the ball screw shaft 521 and is moved up and down along axis of rotation Q by rotation of the ball screw shaft 521. Moreover, the elevation unit 520 is further provided with a roughly L-figured elevation bar 524, which has one end fixed to the elevation nut section 523 and is moved up and down in accordance with ascent and descent of the elevation nut section 523, and another end of the elevation bar 524 is arranged so as to be placed between two bearing sections 525 attached to an upper portion of the spline shaft 511.

With the above-mentioned structure possessed by the elevation unit 520, when the elevation nut section 523 is moved up or down by rotation of the ball screw shaft 521, the elevation bar 524 is moved up or down to push up or push down the spline shaft 511 via the bearing sections 525 by its end portion, thereby allowing the spline shaft 511 to be moved up and down. It is to be noted that ascent and descent of the elevation bar 524 is guided by an LM guide 526 provided on the elevation frame 542.

Moreover, as a component placement head as described above, there has conventionally been a head section provided with a plurality of suction nozzles that serve as one example of component holding members arranged in a line.

In the head section described above, efficiency of placing components onto a circuit board has been improved by making the suction nozzles concurrently suck and hold a plurality of components. Moreover, during such a component placement operation by the head section, an elevating operation of the suction nozzles is to be performed. However, due to a necessity for performing individual elevating operations of the suction nozzles, the head section is provided with elevation units corresponding one to one to the suction nozzles.

Moreover, the head section described above is generally able to individually perform the elevating operation of the suction nozzles by generally performing an elevating operation of the shaft sections capable of being detachably equipped with a suction nozzle at its end by respective elevation units (these shaft sections are also provided for the head section while being arranged in a line). Moreover, the elevation units generally employ a mechanism employing a ball screw shaft section and a nut section meshed therewith, and rotatively drive the ball screw shaft section by rotatively driving the drive motor attached to the ball screw shaft section, thereby moving up and down the nut section and enabling the elevating operation of the shaft section in a state in which it can be moved up and down in synchronization with ascent and descent of the nut section while being engaged with the nut section.

Next, FIG. 14 shows a schematic explanatory view of elevation units 410 of the head section 400 described above, and a method for detecting an origin that becomes a reference point of ascent and descent of each of the elevation units 410 (refer to, for example, Japanese unexamined Patent Publication No. 62-236655) will be described with reference to FIG. 14.

As shown in FIG. 14, the head section 400 is provided with eight elevation units 410, i.e., eight suction nozzles (not shown). Moreover, each of the elevation units 410 is provided with a ball screw shaft section 411, a nut section 412, a drive motor 413 and an upper end position restricting frame 414 for restricting an upper end position of elevation of the nut section 412.

Moreover, the head section 400 is provided with a control section 409 capable of individually controlling these elevation units 410. Each of the elevation units 410 is further provided with an encoder (not shown) capable of detecting a rotational angle of the drive motor 413 and outputting this detection result to the control section 409.

When detecting an origin in the head section 400 described above, by detecting the rotational angle by the encoder while rotatively driving the drive motor 413 in each of the elevation units 410 and assuming a position of the nut section 412 on an elevating operational axis when the origin of rotation in the rotational direction is detected as the origin (hereinafter referred to as a detection origin), each of plural detection origins is set by the control section 409.

It is to be noted that these operations may be executed either individually or concurrently in the elevation units 410. Subsequently, an elevating operation of each of the suction nozzles for a component placement operation is executed in the head section 400 regarding a detection origin thus set as an origin on an actual elevating operational axis (hereinafter referred to as an axial origin).

SUMMARY OF INVENTION

However, in the head section 500 having the aforementioned structure, the first spline nut 512 and the second spline nut 513 have their outer peripheral surfaces rotatably supported via the bearing section 514 and the bearing section 515, respectively, to the shaft frame 541 in each of the shaft sections 510. Accordingly, there is a problem in that outside diameter dimensions of the bearing sections 514 and 515 are increased by the first spline nut 512 and the second spline nut 513 being interposed, and an arrangement interval of the spline shafts 511 arranged in a line cannot be shortened, thereby hindering downsizing of the head section 500.

Moreover, when an outside diameter dimension of the spline shafts 511 is reduced to solve the above-mentioned problem, it is sometimes difficult to secure rigidity required for placement of electronic component 501. In such a case, it is sometimes a case where the spline shaft 511 is bent by an external force received during replacement of suction nozzle 502 to be equipped or in another case, and this also leads to a problem in that this arrangement cannot cope with placement of electronic components that require high-accuracy positioning.

Moreover, in each of the shaft sections 510, the first spline nut 512, the second spline nut 513, the bearing sections 514 and 515, the outer cylindrical collars 516 and 518 and the bearing sections 517 and 519 are individually processed and thereafter assembled. Therefore, it is difficult to make axes of rotation coincide with axis of rotation P of the spline shaft 511. In such a case, there is also a problem of displacement due to rotation occurring at an end of the suction nozzle 502 equipped for the nozzle attaching portion 511a of the spline shaft 511.

Moreover, it is also difficult to make axes of rotation of mutually connected shaft gear 531, coupling 535 and outer cylindrical collar 516 coincide with axis of rotation P for a similar reason, and joint portions of the members receive stress due to misalignment of the axes of rotation. In such a case, there is also a problem in that rotational accuracy is reduced and this arrangement cannot cope with placement of electronic components that require high-accuracy positioning.

Moreover, the rotating unit 530 has a structure in which one driving gear 533 and the four mutually adjacent shaft gears 531 are in engagement inside one cogged belt 532. Therefore, even if a tension is consistently applied to the tension rollers 537, particularly an area of engagement of the cogged belt 532 with two shaft gears 531 out of the four shaft gears 531 is less than that of the shaft gears 531 located at both ends, thereby possibly resulting in slippage between the two shaft gears 531 and the cogged belt 532. In such a case, there is a problem that influence is exerted on rotational accuracy of the spline shafts 511, i.e., rotational accuracy of the suction nozzles 502, and this arrangement cannot cope with placement of electronic components that require high-accuracy positioning.

On the other hand, the aforementioned origin detection method in the head section 400 does not confirm whether a detection origin actually coincides with the axial origin. Therefore, in a case where, for example, an error occurs during detection of the origin of rotation by the encoder, there is a problem in that the detection origin does not coincide with the axial origin, thereby possibly causing a placement error in a subsequent component mounting operation and failing in executing a reliable placement operation. Moreover, there is also a problem in that high-accuracy component placement cannot be achieved if a situation does not get worse to such an extent that a placement error occurs.

As a method for solving such a problem, it can be considered to provide each of the elevation units 410 individually with a sensor for confirming a position of elevation of each of the nut sections 412 and confirm that the detection origin coincides with the axial origin by each of these sensors.

However, such an origin detection method passes for a case where the head section is provided with one suction nozzle. However, when the head section 400 is provided with eight suction nozzles and further when eight elevation units 410 are provided so as to correspond one to one to the suction nozzles, it is required to provide the elevation units 410 with respective sensors, i.e., provide the head section 400 with eight sensors in total. Accordingly, there is a problem in that construction of the head section 400 becomes complicated for origin detection, and this becomes a factor of hindering downsizing of the head section, and thereby failing in suppressing production cost of the head section 400.

Accordingly, an object of the present invention is to solve the aforementioned problems and provide a component placement head and an origin detection method by which the component placement head is capable of coping with a high-accuracy component placement operation on a circuit board by use of a component placement head that holds a plurality of components by a plurality of component holding members and places the components onto the circuit board, thereby permitting downsizing and improving productivity per unit area in placing the components.

In order to achieve the aforementioned object, the present invention is constructed as follows.

According to a first aspect of the present invention, there is provided a component placement head comprising:

component holding members for releasably holding components;

shaft sections detachably equipped with the component holding members, respectively;

elevation units for executing elevating operations of the component holding members, respectively;

a rotating unit for executing rotational operation of each of the component holding members for correction of holding postures of components held by the component holding members; and a head frame that has shaft support sections for supporting the shaft sections and supports the elevation units and the rotating unit, with the component placement head being able to place the components held by the component holding members onto a circuit board, with the shaft sections each comprising:

a spline shaft that has a holding member attaching portion for detachably equipping with a component holding member at its end portion, and is rotatable around an axis of rotation by the rotating unit, elevatable along the axis of rotation by a corresponding elevation unit, and arranged so as to penetrate a corresponding shaft support section;

a first spline nut and a second spline nut that are arranged apart from each other along the axis of rotation in the vicinity of an upper end and a lower end, respectively, of the shaft support section, and elevatably support the spline shaft; and cylindrical members that have inner peripheral portions fixed to outer peripheral portions of the first spline nut and the second spline nut, and join the first spline nut to the second spline nut so as to put the spline nuts into an integrated state, and with the cylindrical members being supported, in the vicinity of the upper end and the lower end of the shaft support section, rotatably around the axis of rotation via two bearing sections, thereby elevatably and rotatably supporting the shaft section by the shaft support section.

According to a second aspect of the present invention, there is provided a component placement head as defined in the first aspect, wherein in each of the shaft sections, the spline shaft and the cylindrical members are processed by cutting so that an axis of rotation of the spline shaft coincides with axes of rotation of the cylindrical members in a state in which the first spline nut, the second spline nut and the cylindrical members are assembled with the spline shaft.

According to a third aspect of the present invention, there is provided a component placement head as defined in the first aspect, wherein the cylindrical members in each of the shaft sections are integrally formed of:

a first cylindrical member that has a nut fixation portion whose inner peripheral portion is fixed to an outer peripheral portion of the first spline nut, and a support portion whose outer peripheral portion is supported by one bearing section of the two bearing sections;

a second cylindrical member that has a nut fixation portion whose inner peripheral portion is fixed to an outer peripheral portion of the second spline nut, and a support portion whose outer peripheral portion is supported by the other bearing section of the two bearing sections; and a cylindrical joint member that joins the first cylindrical member to the second cylindrical member, with a stepped portion being formed between the support portion and the nut fixation portion so that a diameter of an outer peripheral portion of the support portion is smaller than a diameter of an inner peripheral portion of the nut fixation portion at each of the first cylindrical member and the second cylindrical member.

According to a fourth aspect of the present invention, there is provided a component placement head as defined in the third aspect, wherein the rotating unit comprises:

a transmission gear section whose inner peripheral portion is fixed to an outer peripheral portion of the support portion of either one of the first cylindrical member and the second cylindrical member in each of the shaft sections;

a cogged belt that internally has a plurality of teeth capable of being engaged with the transmission gear section, and is engaged with the transmission gear section; and a rotating drive section that rotatively drives the cogged belt, whereby the support portion is rotatively driven by rotatively driving the transmission gear section around its axis of rotation via the cogged belt by the rotating drive section in each of the shaft sections, thereby enabling the spline shaft to be rotatably driven via the first spline nut and the second spline nut.

According to a fifth aspect of the present invention, there is provided a component placement head as defined in the fourth aspect, further comprising:

four shaft sections constructed of a first shaft section through a fourth shaft section arranged mutually adjacent in a line, as shaft sections, wherein the rotating unit comprises:

four transmission gear sections constructed of a first transmission gear section through a fourth transmission gear section attached to the first shaft section to the fourth shaft section, respectively, as transmission gear sections; and a first cogged belt engaged with only the first transmission gear section and the third transmission gear section from among the four transmission gear sections, and a second cogged belt engaged with only the second transmission gear section and the fourth transmission gear section, as cogged belts, with the rotating drive section comprising one rotating drive shaft section that is engaged with the first cogged belt and the second cogged belt, and is able to rotatively drive both the first cogged belt and the second cogged belt.

According to a sixth aspect of the present invention, there is provided a component placement head as defined in the third aspect or fourth aspect, wherein each of the elevation units comprises:

a ball screw shaft section supported rotatably around its axis of rotation;

a rotating drive section that is fixed to an end portion of the ball screw shaft section and is for rotating the ball screw shaft section around the axis of rotation;

an elevation nut section that is meshed with the ball screw shaft section and is elevatable along an axis of rotation center of the ball screw shaft section by rotation of the ball screw shaft section; and an engagement member that is fixed to the elevation nut section and engaged with the spline shaft of a corresponding shaft section, and is able to move up and down the spline shaft in synchronization with ascent and descent of the elevation nut section, with the elevation nut section being elevatable along the axis of rotation in a state in which rotation of the ball screw shaft section around the axis of rotation is restricted only by engagement of the engagement member with the spline shaft.

According to a seventh aspect of the present invention, there is provided a component placement head as defined in the first aspect, wherein the shaft sections are arranged mutually in a line, and the elevation units are comprised of a plurality of elevation units that correspond one to one to the shaft sections and are for moving up and down the shaft sections along respective axes of rotation, with each of the elevation units comprising:

a ball screw shaft section supported rotatably around its axis of rotation;

a rotating drive section that is fixed to an end portion of the ball screw shaft section, and is for rotating the ball screw shaft section around the axis of rotation;

an elevation nut section that is meshed with the ball screw shaft section and is elevatable along the axis of rotation of the ball screw shaft section by rotation of the ball screw shaft section; and an engagement member that is fixed to the elevation nut section and engaged with a corresponding shaft section, and is able to move up and down the shaft section in synchronization with ascent and descent of the elevation nut section, and with the component placing head further comprising:

a light transmission unit that is provided with a light-projecting section and a light-receiving section arranged so as to be opposite to each other in a direction along an array direction of the ball screw shaft sections, is able to have arranged the elevation nut sections between the light-projecting section and the light-receiving section, and is able to detect presence or absence of interruption of light by the elevation nut sections by receiving light emitted from the light-projecting section toward the light-receiving section by the light-receiving section;

a plurality of rotational angle detecting sections capable of detecting a rotational angle of the rotating drive section provided for each of the elevation units; and an origin detection control section operable to set an origin of elevation of the elevation nut section by detecting a rotational angle by the rotational angle detecting section in each of the elevation units, individually move down the elevation nut sections located in respective set origin positions so that light emitted from the light-projecting section is received by the light-receiving section without being interrupted, and detect interruption of light emitted from the light-projecting section by a lowered elevation nut section, by the light-receiving section in a position where the elevation nut section is lowered from each of set origins by a prescribed light interruption dimension, thereby confirming that the set origins are origins of elevation to execute detection of the origins.

According to an eighth aspect of the present invention, there is provided a component placement head as defined in the seventh aspect, wherein each of the elevation units further comprises:

an overload detecting section capable of detecting an overload of the rotating drive section; and restricting portions that are fixed to the ball screw shaft section while being located apart from each other, and are for restricting mechanically an upper end position and a lower end position of elevation of the elevation nut section, with the origin detection control section being operable to reverse a rotational direction of the rotating drive section when an overload of each of the rotating drive sections is detected by a respective overload detection section by moving each of the elevation nut sections to the upper end position of the elevating operation and bringing each of the elevation nut sections into contact with the restricting portion in the upper end position, and detect a rotational angle by the rotational angle detection section in each of the elevation units after reversing, and thereby set a position along an axial center of the elevation nut section when an origin of rotation of the rotating drive section is detected at a first time as an origin of elevation.

According to a ninth aspect of the present invention, there is provided a component placement head as defined in the seventh aspect, wherein the light-projecting section and the light-receiving section are arranged so that light emitted from the light-projecting section can be transmitted and received by the light-receiving section in each of positions located apart by a prescribed light interruption dimension downwardly along an axis of rotation of each of the ball screw shaft sections from each of the origins.

According to a tenth aspect of the present invention, there is provided a component placement head as defined in any one of the seventh aspect through ninth aspect, wherein each of the elevation nut sections can consistently interrupt light emitted from the light-projecting section in a position of elevation of the elevation nut section between each of positions located apart by the prescribed light interruption dimension downwardly along each of axes of rotation from each of the origins and a lower end position of elevation of the elevation nut section.

According to an eleventh aspect of the present invention, there is provided an origin detection method for a component placement head having:

shaft sections that each have an end portion provided with a component holding member for releasably holding components, and are arranged in a line;

elevation units that correspond one to one to the shaft sections and are for moving up and down each of the shaft sections along its axis of rotation, with the elevation units each being comprised of, a ball screw shaft section supported rotatably around its axis of rotation, a rotating drive section that is fixed to an end portion of the ball screw shaft section and is for rotating the ball screw shaft section around the axis of rotation, an elevation nut section that is meshed with the ball screw shaft section and is elevatable along the axis of rotation of the ball screw shaft section by rotation of the ball screw shaft section, and an engagement member that is fixed to the elevation nut section and engaged with a corresponding shaft section, and is able to move up and down the shaft section in synchronization with ascent and descent of the elevation nut section; and a light-projecting section and a light-receiving section, which are arranged opposite to each other in a direction along an array direction of the ball screw shaft sections, are able to have arranged each of the elevation nut sections between the light-projecting section and the light-receiving section, and are able to detect presence or absence of interruption of light by the elevation nut section by receiving light emitted from the light-projecting section toward the light-receiving section by the light-receiving section, whereby components held by the component holding members are placed onto a circuit board, the method comprising:

setting an origin of elevation of the elevation nut section by detecting a rotational angle of the rotating drive section in each of the elevation units;

individually moving down the elevation nut sections located in respective set origin positions so that light emitted from the light-projecting section is received by the light-receiving section without being interrupted; and confirming that each of the set origins is an origin of elevation by detecting interruption of light emitted from the light-projecting section, by a lowered elevation nut section, toward the light-receiving section in a position where the elevation nut section is lowered from each of the set origins by a prescribed light interruption dimension to execute detection of the origins.

According to a twelfth aspect of the present invention, there is provided an origin detection method for the component placement head defined in the eleventh aspect, comprising:

moving each of the elevation nut sections to an upper end position of its elevating operation, reversing a rotational direction of the rotating drive section when an overload of each of the rotating drive sections is detected at each of the upper end positions, and detecting a rotational angle of each of the elevation units after this reversing, whereby a position along the axis of rotation of the elevation nut section when the origin of rotation of the rotating drive section is detected at a first time can be set as an origin of elevation.

According to a thirteenth aspect of the present invention, there is provided an origin detection method for the component placement head defined in the eleventh aspect, wherein the light-projecting section and the light-receiving section are arranged so that light emitted from the light-projecting section can be transmitted and received by the light-receiving section in each of positions located apart by the prescribed light interruption dimension downwardly along the axis of rotation of each of the ball screw shaft sections from each of the origins.

According to a fourteenth aspect of the present invention, there is provided an origin detection method for the component placement head defined in any one of the eleventh aspect through thirteenth aspect, wherein each of the elevation nut sections can consistently interrupt light emitted from the light-projecting section in a position of elevation of the elevation nut section between each of positions located apart by the prescribed light interruption dimension downwardly along the axis of rotation from each of the origins, and a lower end position of elevation of the elevation nut section, and movement of each of the component holding members in a direction along a surface of the circuit board is inhibited in a state in which light is interrupted.

According to the first aspect of the present invention, the cylindrical member is fixed to the outer peripheral portions of the first spline nut and the second spline nut, which are arranged apart from each other in the vicinity of the upper end and the lower end of the shaft support section at the shaft sections of the component placement head and elevatably support the spline shaft along the axis of rotation thereof. With this arrangement, the two spline nuts, i.e. the first spline nut and the second spline nut, can be joined to each other and put into an integrated state.

Furthermore, the cylindrical member is supported, in the vicinity of the upper end and the lower end of the shaft support section, rotatably around the axis of rotation via the two bearing sections. With this arrangement, the two spline nuts put in the above-mentioned integrated state can be supported rotatably, around the axis of rotation via the two bearing sections, by the shaft support section. That is, the two spline nuts can be rotatably supported by the two bearing sections, and an amount of the bearing sections to be provided for supporting the spline nuts can be reduced in the bearing sections.

Therefore, the bearing sections can easily be assembled in the component placement head, and a production cost of the component placement head can be reduced. In addition, since an amount of the bearing sections to be provided can be reduced, a rotational center positional alignment of the axis of rotation of each of the spline shafts with the axis of rotation of each of the bearing sections (i.e., also the axis of rotation of the cylindrical member) can be facilitated. An amount of displacement of the axis of rotation due to rotation of the component holding member equipped for each of the shaft sections can be reduced, and rotational accuracy can be improved. Accordingly, there can be provided a component placement head capable of coping with component placement that requires high-accuracy component positioning.

According to the second aspect of the present invention, the spline shaft and the cylindrical member are machined so that the axis of rotation of the spline shaft coincides with the axis of rotation of the cylindrical member in a state in which the spline shaft, the first spline nut, the second spline nut and the cylindrical member are assembled into an integrated body before each of the shaft sections are assembled and attached to the component placement head. With this arrangement, the above-mentioned axes of rotation can be made to roughly coincide with one another with high accuracy. Therefore, the component placement head, which is assembled by inserting the shaft sections into the shaft frame while being rotatably supported, can cope with component placement that requires high-accuracy component positioning.

According to the third aspect of the present invention, in each of the shaft sections, the cylindrical member is integrally formed of: the first cylindrical member provided with the nut fixation portion whose inner peripheral portion is fixed to the outer peripheral portion of the first spline nut arranged in the vicinity of either one of the upper end and the lower end of the shaft support section, and the support portion supported by one bearing section out of the two bearing sections by its outer peripheral portion; the second cylindrical member provided with the nut fixation portion whose inner peripheral portion is fixed to the outer peripheral portion of the second spline nut arranged in the vicinity of the other one of the upper end and the lower end of the shaft support section, and the support portion is supported by the other bearing section out of the two bearing sections by its outer peripheral portion; and the cylindrical joint member for joining the first cylindrical member to the second cylindrical member, and the stepped portion is formed between the support portion and the nut fixation portion so that a diameter of the outer peripheral portion of the support portion is smaller than a diameter of the inner peripheral portion of the nut fixation portion in each of the first cylindrical member and the second cylindrical member. With this arrangement, a diameter of an inner peripheral portion of each of the bearing sections can be made smaller than a diameter of an outer peripheral portion of each of the spline nuts.

As described above, when the diameter of the inner peripheral portion of the bearing section can be reduced, an outside diameter of each of the shaft sections can be reduced, and an arrangement interval between the spline shafts provided for the component placement head can be narrowed, thereby allowing a downsized component placing head to be provided. In such a case, a component placement apparatus provided with such a downsized component placement head can also be downsized, and there can be provided a component placement head capable of improving productivity per unit area in placing components by reducing an installation area of the component placement apparatus.

Conversely, when the outside diameter of each of the shaft sections is not reduced, the outside diameter of the spline shaft can be increased without changing the outside diameter of the shaft section, and rigidity of the spline shaft can be improved. In such a case, for example, even when an external force is applied to the spline shaft during replacement of a component holding member or the like, occurrence of displacement of the axis of rotation of the spline shaft can be prevented by this improved rigidity, and a component placement head that has higher rotational accuracy can be provided.

According to the fourth aspect of the present invention, in the rotating unit of the component placement head, dissimilarly to a conventional case where the transmission gear section is attached to the shaft section via the coupling, the transmission gear section is attached to the shaft section in a state in which an inner peripheral portion thereof is directly fixed to an outer peripheral portion of the support portion of either one of the first cylindrical member and the second cylindrical member. With this arrangement, the misalignment of the axis of rotation of the transmission gear section with respect to the axis of rotation of the spline shaft due to existence of a coupling can be reduced. Therefore, concentricity of axes of rotation of the transmission gear section and the spline shaft can be improved, and there can be provided a component placement head of which rotational accuracy is improved.

According to the fifth aspect of the present invention, in the rotating unit, dissimilarly to the conventional case where four transmission gear sections are engaged with one another by one cogged belt, the rotating unit is provided with two cogged belts, i.e. the first cogged belt and the second cogged belt. The first cogged belt is engaged with the first transmission gear section and the third transmission gear section, while the second cogged belt is engaged with the second transmission gear section and the fourth transmission gear section. With this arrangement, areas of engagement of the four transmission gear sections can be made uniform in a state in which areas of engagement of the cogged belts with respect to respective transmission gear sections is sufficiently secured. With this arrangement, deviation in rotational accuracy, which has occurred due to a deviation in an area of engagement, can be prevented. In addition, by sufficiently securing an area of engagement, there can be provided a component placement head capable of reliably rotating each of the transmission gear sections, and capable of rotating each of the component holding members with high accuracy.

According to the sixth aspect of the present invention, a construction, in which the elevation nut section can be moved up and down along the axial center by the fact that rotation of the ball screw shaft section around the axis of rotation is restricted only by engagement between the engagement member and the spline shaft in each of the elevation units of the component placement head, can be achieved by improving rigidity (i.e., strength) with an outside diameter of the spline shaft formed large by support structure while an outside diameter of the bearing section is maintained. Therefore, a restricting member (e.g., LM (Line Motion) guide), which has been needed for receiving a rotation moment transmitted from the elevation nut section to the spline shaft via the engagement member in a support structure such that the outside diameter of the spline shaft cannot be formed large as in a conventional component placement head, can be made unnecessary in the component placement head of the aforementioned sixth aspect. With this arrangement, there can be provided a further downsized component placement head capable of reducing a dimension between the axis of rotation of the spline shaft and the axis of rotation of the ball screw shaft section by not requiring the conventional restricting member and improving productivity per unit area.

According to the seventh aspect or the eleventh aspect of the present invention, instead of detecting the rotational angle of each of the rotating drive sections using each of the rotational angle detecting sections provided for the component placement head, by setting the origin of elevation of each of the elevation nut sections and thereafter executing a component placement operation by moving up and down each of the component holding members in the component placement head directly using the set origins without confirming the set origins, it is confirmed whether or not these set origins actually coincide with the origins of elevation. Therefore, even if a malfunction (setting error) occurs during setting of each of the origins, this setting error can surely be detected, and a placement error due to the fact that the set origin does not coincide with the origin of elevation can be prevented from occurring in advance during a subsequent component placement operation performed by the component placement head, and reliable origin detection can be performed.

Moreover, the above-mentioned origin detection can be achieved by providing the component placement head with only one light transmission unit, which is provided with the light-projecting section and the light-receiving section arranged so as to be opposite to each other in the direction along the array direction of the ball screw shaft sections, is able to have arranged each of the elevation nut sections between the light-projecting section and the light-receiving section, and is able to detect presence or absence of interruption of light by the elevation nut section, by receiving the light emitted from the light-projecting section toward the light-receiving section by the light-receiving section.

That is, by individually moving down each of the elevation nut sections located in respective set origin positions so that light emitted from the light-projecting section of the provided one light transmission unit is received by the light-receiving section without being interrupted, and detecting interruption of the light emitted from the light-projecting section, by a lowered elevation nut section, toward the light-receiving section in a position lowered by the prescribed light interruption dimension from each of the set origins, it can be confirmed that each of the set origins is the origin of the elevation, and detection of each of the origins can be performed.

Therefore, even if a plurality of component holding members are provided as in the case of the aforementioned component placement head, the origin can be confirmed by provision of one light transmission unit with the component placement head without providing each of the elevation units with a unit for confirming the origin. Accordingly, there can be provided a component placement head capable of executing reliable origin detection with a simpler construction, and a production cost can also be suppressed. As a result, there can be provided a component placement head capable of achieving downsizing of the component placement head while being able to cope with a high-accuracy component placement operation and improving productivity per unit area during component placement.

Moreover, the light transmission unit is able to detect whether or not light emitted from the light-projecting section is directly interrupted by the elevation nut section, so that construction of the component placement head can be simplified by providing no special light shield plate (e.g., DOG etc.) for interruption of the light.

According to the eighth aspect or the twelfth aspect of the present invention, in the component placement head, each of the elevation units is further provided with the overload detecting section capable of detecting an overload of the rotating drive section, and each of the restricting portions that are fixed to the ball screw shaft section while being located apart from each other and mechanically restricts an upper end position and a lower end position of elevation of the elevation nut section. By reversing a rotational direction of the rotating drive section when the overload of each of the rotating drive sections is detected in each of the overload detection sections by moving each of the elevation nut sections to the upper end position of the elevating operation and bringing each of the elevation nut sections into contact with the restricting portion in the upper end position in the origin detection control section, and detecting a rotational angle by the rotational angle detection section in each of the elevation units after the reversing, a position of the elevation nut section along the axial center when the origin of rotation of the rotating drive section is detected at a first time can be set as the origin of the elevation. With this arrangement, each of the origins can be set by using each of the rotational angle detection sections and each of the overload detection sections. Therefore, in addition to effects of the seventh aspect or the eleventh aspect, each of the origins can be detected with a simple construction of each of the rotational angle detection sections and each of the overload detection sections, thereby providing the component placement head with neither a complicated mechanism nor unit for detection of each of the origins.

According to the ninth aspect or the thirteenth aspect of the present invention, the light-projecting section and the light-receiving section are arranged so that light emitted from the light-projecting section can be transmitted and received by the light-receiving section in each of positions located apart by a prescribed light interruption dimension downwardly along the axial center of each of the ball screw shaft sections from each of the origins. With this arrangement, by confirming interruption of the light emitted from the light-projecting section by a lowered elevation nut section in a position in which the elevation nut section is lowered from the set origin by the prescribed light interruption dimension, it can be confirmed that the set origin is the origin of elevation, and detection of the origin can be executed reliably and correctly.

According to the tenth aspect or the fourteenth aspect of the present invention, each of the elevation nut sections can consistently interrupt light emitted from the light-projecting section in a position of elevation of the elevation nut section between each of positions located apart by a prescribed light interruption dimension downwardly along an axial center from each of the origins and the lower end position of elevation of the elevation nut section. With this arrangement, when interruption of light is detected by the light transmission unit, by inhibiting movement of the main body of the component placement head along a surface of a circuit board, there can be prevented interference of component holding members with constituent members of the electronic component placement apparatus provided with the above-mentioned component placement head and other components placed on the circuit board. That is, in the component placement head, the detection of light by the light transmission unit can be used as an interference prevention interlock of each of the component holding members in addition to use thereof for origin detection. This obviates a need for providing the component placement head with a special sensor or the like for providing the above-mentioned interlock and allows construction of the component placement head to be made simpler.

BRIEF DESCRIPTION OF DRAWINGS

These and other aspects and features of the present invention will become clear from the following description taken in conjunction with preferred embodiments thereof with reference to the accompanying drawings, in which:

FIGS. 9A, 9B, 9C, and 9D are schematic explanatory views showing an origin detecting operation of each of elevation nut sections in the head section of FIG. 8, where FIG. 9A shows an initial state at a start of the origin detecting operation, FIG. 9B shows a state in which one elevation nut section is moved up to an upper end position of elevation thereof, FIG. 9C shows a state in which a detection origin is set in each of the elevation nut sections, and FIG. 9D shows a state in which one elevation nut section is moved down to an optical axis position of a light transmission unit to confirm whether or not the detection origin coincides with an axial origin;

FIGS. 10A, 10B, and 10C are schematic explanatory views (also views in a direction of arrow A of the head section of FIGS. 9A through 9D) showing a position of elevation of an elevation nut section during the origin detecting operation in each of the head sections of FIG. 8, wherein FIG. 10A shows a state in which the elevation nut section is located at the detection origin, FIG. 10B shows a state in which interruption of light is detected by the light transmission unit, and FIG. 10C shows a state in which the elevation nut section is further lowered from the state of FIG. 10B;

DETAILED DESCRIPTION OF THE PREFERRED EMBODIMENTS

Figure 1:
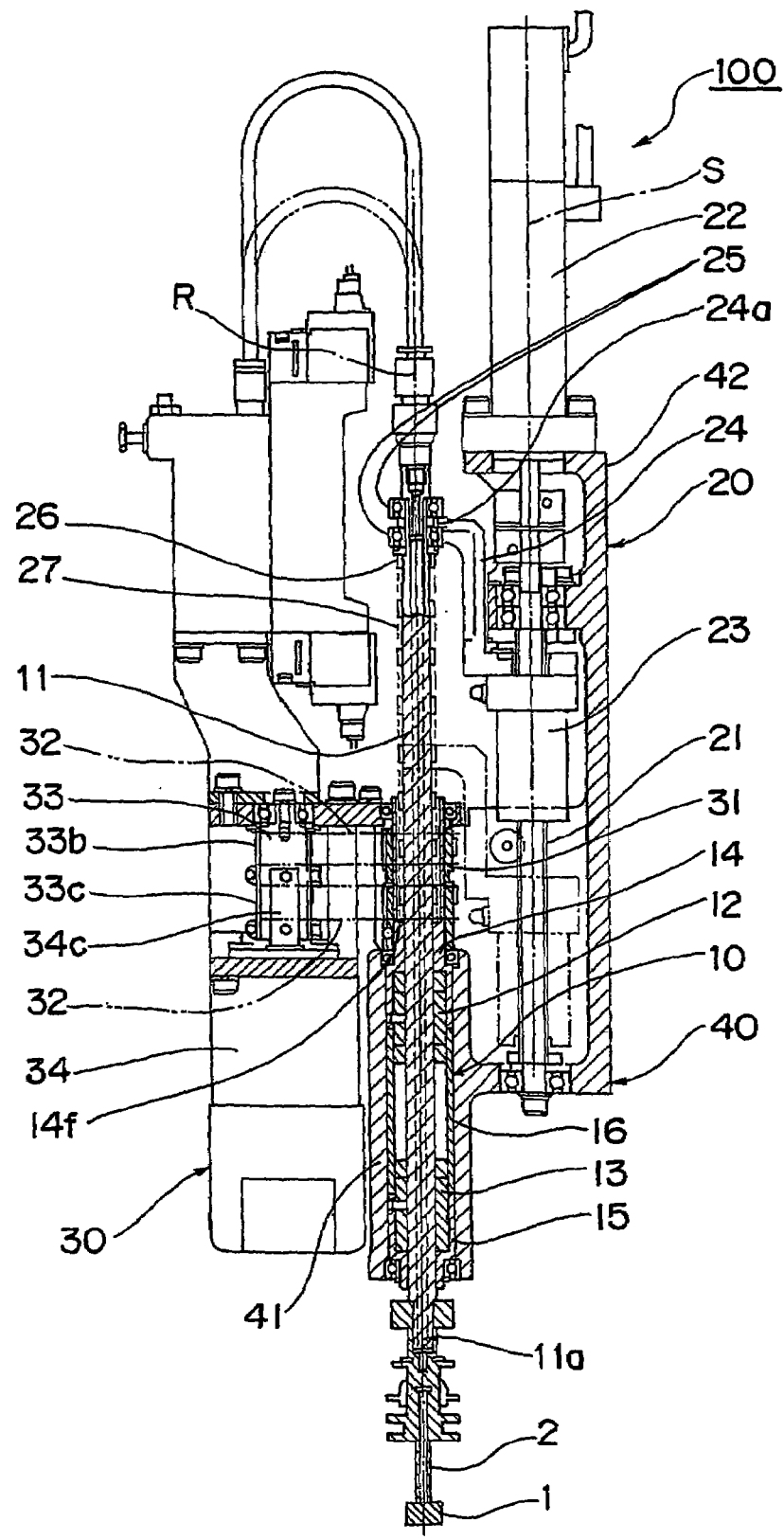
FIG. 1 is a sectional view of a head section according to a first embodiment of the present invention.

Before description of the present invention proceeds, it is to be noted that like parts are designated by like reference numerals throughout the accompanying drawings.

Embodiments of the present invention will be described in detail below with reference to the drawings.

First Embodiment

FIG. 1 shows a sectional view of a head section 100 that is one example of a component placement head according to a first embodiment of the present invention.

As shown in FIG. 1, the head section 100 is provided with a suction nozzle 2 that is one example of a component holding member for releasably sucking and holding an electronic component 1 such as a chip component as one example of the component. Although not shown, this head section 100 is used while being equipped for an electronic component placement apparatus for placing the electronic component 1 onto a circuit board held on a machine base. The head section 100 is movably supported roughly parallel to a surface of the circuit board by, for example, an X-Y robot above the machine base and is able to execute a component placement operation by making the suction nozzle 2 of the head section 100 releasably hold the electronic component 1, thereafter aligning in position a placement position of the electronic component 1 on the circuit board with the held electronic component 1, and moving down the suction nozzle 2 to place the electronic component 1 in the placement position of the circuit board. It is to be noted that positional alignment is also executed in the head section 100 by rotatively moving the suction nozzle 2 around an axis of rotation thereof that is an axial center thereof (i.e., rotation by an angle of θ) in addition to movement of the head section 100 itself by the X-Y robot. That is, the suction nozzle 2 is able to elevatably move and rotatively move in the head section 100.

Structure of the above-mentioned head section 100 will be described in detail. As shown in FIG. 1, the head section 100 is provided with a shaft section 10 that is one example of a shaft section to be detachably equipped for the suction nozzle 2, an elevation unit 20 for moving up and down the suction nozzle 2 equipped for the shaft section 10 via this shaft section 10, and a rotating unit 30 for rotating the suction nozzle 2 around the axis of rotation thereof (i.e., rotating it by an angle of θ) via the shaft section 10.

Moreover, in the electronic component placement apparatus equipped with the above-mentioned head section 100, there is often used a technique for increasing an amount of electronic components 1 that can be held at a time by a plurality of suction nozzles 2 equipped for the head section in order to improve placement efficiency by reducing time required for placing the electronic component 1 onto the circuit board. The head section 100 of the present first embodiment is also able to be equipped with eight suction nozzles 2 as one example. That is, the head section 100 is provided with eight sets of shaft sections 10 and elevation units 20. The shaft sections 10 are arranged at a constant interval pitch in a line (i.e., the suction nozzles 2 equipped for the shaft sections 10 are arranged at the constant interval pitch in a line), and the elevation units 20 are arranged in a line so as to correspond one to one to the respective shaft sections 10. Moreover, the eight sets of shaft sections 10 and elevation mechanisms 20 are supported by a head frame 40 provided for the head section 100 in the above-mentioned arrangement. Moreover, the rotating unit 30 is able to rotate four suction nozzles 2 equipped for four mutually adjacent shaft sections 10. In the head section 100 capable of being equipped with eight suction nozzles 2, two rotating units 30 are provided while being supported by the head frame 40.

(Shaft Section)

With regard to the head section 100 having the above-mentioned construction, detailed structure of the shaft section 10 will be described first. It is to be noted that the eight shaft sections 10 provided for the head section 100 have similar structures. Therefore, in the following description of structure of the shaft section 10, one shaft section 10 out of these shaft sections will be described unless specially mentioned.

As shown in FIG. 1, each of the shaft sections 10 is provided with a spline shaft 11, at an end portion of which (lower end in the figure) a nozzle attaching portion 11a, that is one example of the holding member attaching portion detachably equipped with the suction nozzle 2, is formed. Moreover, in order to make rotatable the suction nozzle 2 equipped for the nozzle attaching portion 11a via the spline shaft 11, the spline shaft 11 is made rotatable around axis of rotation R thereof (being also an axial center of the spline shaft 11) by a corresponding rotating unit 30. Moreover, in order to similarly make this equipped suction nozzle 2 elevatable via the spline shaft 11, the spline shaft 11 can be moved up and down along the axis of rotation R by a corresponding elevation unit 20.

As described above, in a state in which this spline shaft 11 is rotatable and elevatable in the shaft section 10, the shaft section 10 is supported by the head frame 40. Next, support structure of this shaft section 10 will be described with reference to a partially enlarged schematic view of the shaft section 10 shown in FIG. 2.

Figure 2:
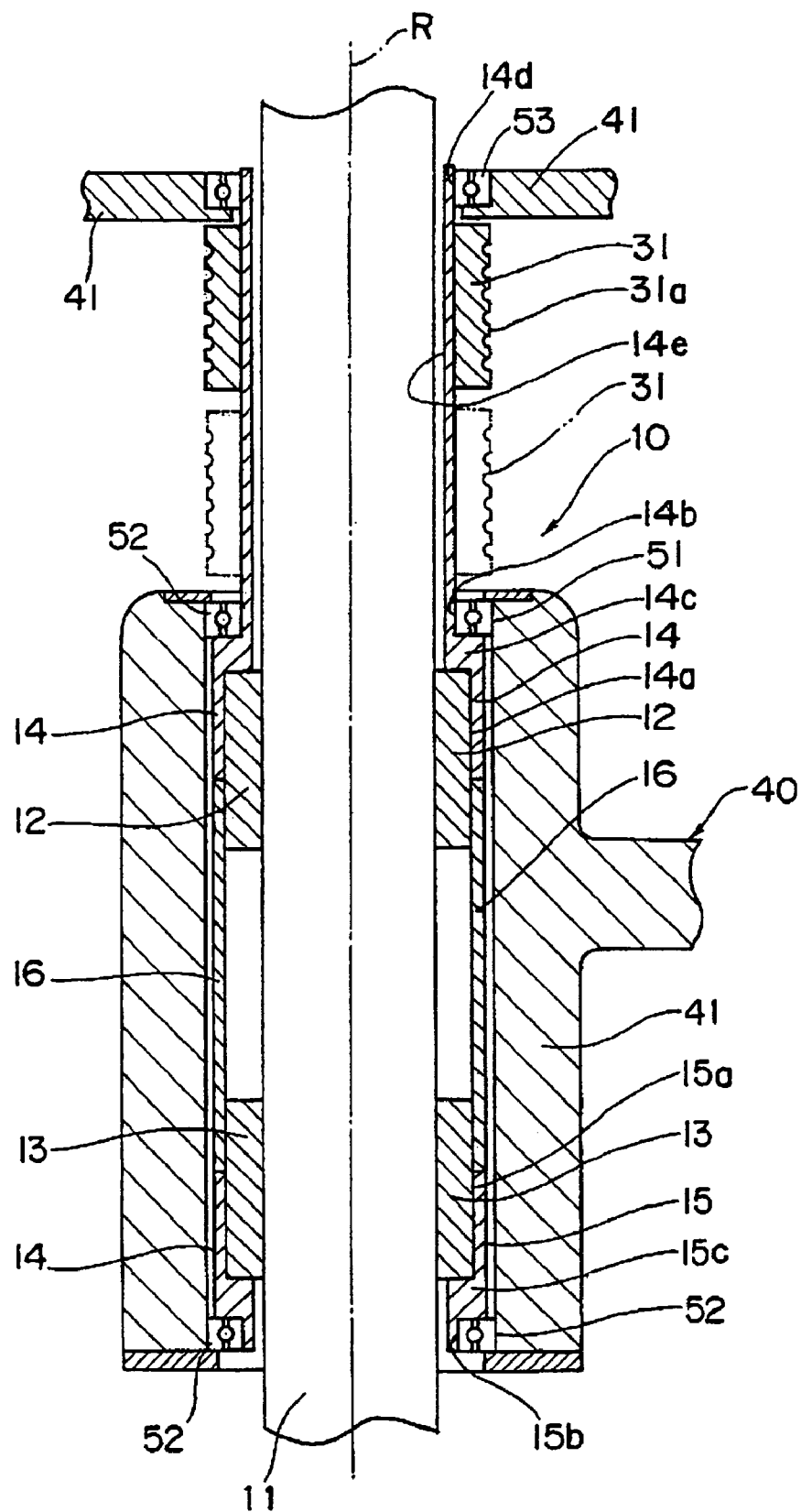
FIG. 2 is a partially enlarged schematic sectional view of a shaft section in the head section of FIG. 1.

As shown in FIG. 2, the shaft section 10 is further provided with a first spline nut 12 (arranged on an upper side in the figure) and a second spline nut 13 (arranged on a lower side in the figure), which have a roughly cylindrical shape and are arranged apart from the spline shaft 11 along the axis of rotation R of the spline shaft 11 so that an inner peripheral surface thereof is brought into contact with an outer peripheral surface of the spline shaft 11, and which are two spline nuts for elevatably supporting the spline shaft 11.

Moreover, as shown in FIG. 2, the shaft section 10 is further provided with a first outer cylindrical collar 14 that is one example of a first cylindrical member, which has a roughly cylindrical shape and an inner peripheral surface of which has a first nut fixation portion 14a, that is one example of a nut fixation portion, fixed to an outer peripheral surface (outer peripheral portion) of the first spline nut 12, and a similar second outer cylindrical collar 15 that is one example of a second cylindrical member, which has a roughly cylindrical shape and an inner peripheral surface of which has a second nut fixation portion 15a, that is one example of a nut fixation portion, fixed to an outer peripheral surface (outer peripheral portion) of the second spline nut 13.

Moreover, as shown in FIG. 2, a stepped portion 14c is formed on the first outer cylindrical collar 14 so that a diameter of an upper side of the first nut fixation portion 14a is reduced at an upper end of the first nut fixation portion 14a. Moreover, an outer peripheral surface (assumed to be the first support portion 14b that is one example of the support portion) of a portion where a diameter of this stepped portion 14c is formed small is rotatably supported via a bearing section 51 on an inner peripheral surface of the shaft frame 41 (one example of a shaft support section) that has a roughly cylindrical shape provided for the head frame 40. Moreover, a stepped portion 15c is formed at the second outer cylindrical collar 15 so that a diameter on a lower side in FIG. 2 of the second nut fixation portion 15a is reduced at a lower end, in this figure, of the second nut fixation portion 15a. Moreover, an outer peripheral surface (assumed to be a second support portion 15b that is one example of the support portion) of a portion where a diameter of this stepped portion 15c is formed small is rotatably supported via a bearing section 52 on an inner peripheral surface of the shaft frame 41.

As described above, the first spline nut 12 and the second spline nut 13 are arranged apart from each other. Therefore, as shown in FIG. 2, the first spline nut 12 and the bearing section 51 are arranged in the vicinity of the upper end, in this figure, of the shaft frame 41, while the second spline nut 13 and the bearing section 52 are arranged in the vicinity of the lower end, in this figure, of the shaft frame 41.

Moreover, as shown in FIG. 2, the first nut fixation portion 14a and the outer peripheral surface of the first spline nut 12 are fixed to each other so that a lower portion on the outer peripheral surface of the first spline nut 12 is partially exposed from the first nut fixation portion 14a of the first outer cylindrical collar 14. Likewise, the second nut fixation portion 15a and the outer peripheral surface of the second spline nut 13 are fixed to each other so that an upper portion on the outer peripheral surface of the second spline nut 13 is partially exposed from the second nut fixation portion 15a of the second outer cylindrical collar 15. Further, the shaft section 10 is provided with an intermediate collar 16, which is one example of a cylindrical joint member having a roughly cylindrical shape, and has its roughly cylindrical inner peripheral surface bonded to exposed outer peripheral surfaces of the first spline nut 12 and the second spline nut 13.

It is to be noted that a diameter (outside diameter) of the outer peripheral surface of each of the first spline nut 12 and the second spline nut 13, a diameter (inside diameter) of the inner peripheral surface (inner peripheral portion) of the first nut fixation portion 14a of the first outer cylindrical collar 14, a diameter (inside diameter) of the inner peripheral surface (inner peripheral portion) of the second nut fixation portion 15a of the second outer cylindrical collar 15, and a diameter (inside diameter) of the inner peripheral surface of the intermediate collar 16 are formed so as to have approximately same dimension. Further, both end portions in a vertical direction of the intermediate collar 16, which is fixed to the outer peripheral surfaces of the first spline nut 12 and the second spline nut 13, are connected to end portions of the first outer cylindrical collar 14 and the second outer cylindrical collar 15.

Moreover, in the first outer cylindrical collar 14, the stepped portion 14c is formed so that the diameter of the outer peripheral surface of the first support portion 14b is approximately equal to the diameter of the inner peripheral surface of the first nut fixation portion 14a (i.e., the diameter of the outer peripheral surface of the first spline nut 12) or preferably smaller than the diameter of the inner peripheral surface (e.g., smaller by a dimensional range of about 1 mm to a thickness dimension of the first spline nut 12). Moreover, in the second outer cylindrical collar 15, the stepped portion 15c is similarly formed so that the diameter of the outer peripheral surface of the second support portion 15b is approximately equal to the diameter of the inner peripheral surface of the second nut fixation portion 15a (i.e., the diameter of the outer peripheral surface of the second spline nut 13) or preferably smaller than the diameter of the inner peripheral surface (e.g., smaller by a dimensional range of about 1 mm to a thickness dimension of the second spline nut 13). Moreover, a gap is provided between the inner peripheral surface of the shaft frame 41 and outer peripheral surfaces of the first outer cylindrical collar 14, the second outer cylindrical collar 15 and the intermediate collar 16, with the gap assuring no contact between the collars and the shaft frame.

In the head section 100 of the present first embodiment, components are formed so that, for example, an outside diameter of the spline shaft 11 is 8 mm, the outside diameter of the (first and second) spline nuts 12 and 13 is 15 mm, the diameter of the outer peripheral surface of the (first and second) nut fixation portions 14a and 15a of the (first and second) outer cylindrical collars 14 and 15 is 18 mm, the diameter of the outer peripheral surface of the (first and second) support portions 14b and 15b is 12 mm and the outside diameter of the bearing sections 51 and 52 is 21 mm. Moreover, the first spline nut 12 and the second spline nut 13 are arranged apart from each other at a distance of 50 mm between central positions thereof, and at a distance of 25 mm by a dimension between end portions thereof in a direction along the axis of rotation R.

Moreover, the first spline nut 12, the second spline nut 13, the first outer cylindrical collar 14, the second outer cylindrical collar 15 and the intermediate collar 16 are bonded together in the above-mentioned relationships of arrangement and configuration. With this arrangement, the first spline nut 12 and the second spline nut 13 are put in an integrated state while being joined together via the intermediate collar 16. Also, the first spline nut 12 and the second spline nut 13, which are put in the integrated state, are rotatably supported on the inner peripheral surface of shaft frame 41 via the bearing section 51 at the first support portion 14b of the first outer cylindrical collar 14 and via the bearing section 52 at the second support portion 15b of the second outer cylindrical collar 15, respectively. In the present first embodiment, the first outer cylindrical collar 14, the second outer cylindrical collar 15 and the intermediate collar 16 serve as one example of a cylindrical member that joins the first spline nut 12 and the second spline nut 13 together and put the same into the integrated state. The first spline nut 12 and the second spline nut 13 are arranged in an inner cylindrical portion of the cylindrical member, and the outer peripheral surfaces (portions) thereof are fixed to an inner peripheral surface (portion) of the cylindrical member.

Therefore, with the shaft section 10 having the above-mentioned structure, the spline shaft 11 can move up and down along the axis of rotation R inside the first spline nut 12 and the second spline nut 13 in the shaft section 10, and the spline shaft 11 is rotatable around the axis of rotation R together with the first spline nut 12 and the second spline nut 13 and further with the first outer cylindrical collar 14, the second outer cylindrical collar 15 and the intermediate collar 16.

There is accepted a case where the first outer cylindrical collar 14, the second outer cylindrical collar 15 and the intermediate collar 16 are originally formed as an integrated body instead of a case where the first outer cylindrical collar 14, the second outer cylindrical collar 15 and the intermediate collar 16 are formed as separate components and thereafter assembled together into an integrated body. This is because the first spline nut 12 and the second spline nut 13 can be joined together into an integrated body even in the above-mentioned case.

(Rotating Unit)

Next, detailed structure of the rotating unit 30 will be described. As shown in FIG. 1, the rotating unit 30 is also provided with a shaft gear 31 that is one example of a transmission gear section, which has a roughly cylindrical configuration and is arranged so that the spline shaft 11 penetrates through an interior thereof, and on an outer peripheral surface thereof a plurality of teeth 31a are formed. Moreover, the shaft gear 31 is arranged so that an axis of rotation thereof roughly coincides with the axis of rotation R of the spline shaft 11, and is able to rotate the spline shaft 11 around the axis of rotation R by rotating the first spline nut 12 and the second spline nut 13, put in the integrated state, by being rotated around the axis of rotation thereof.

Further, the rotating unit 30 has a cogged belt 32 having on an inner peripheral surface thereof a plurality of teeth 32a capable of being engaged with the teeth 31a of the shaft gear 31, is further provided with a driving gear 33 on which a plurality of teeth 33a, capable of being engaged with the teeth 32a of the cogged belt 32, are formed, and also provided with a rotating drive motor 34 that is provided with the driving gear 33 fixed to an end of its driving shaft 34a (one example of a rotating drive shaft) and is able to rotate the driving shaft 34a in either a forward or reverse rotational direction. It is to be noted that the driving gear 33 and the rotating drive motor 34 serve as one example of a rotating drive section that drives the cogged belt 32 to make the same rotate (or run) in the first embodiment.

Moreover, as shown in FIG. 2, the first support portion 14b of the first outer cylindrical collar 14 is extended upward in this figure with its diameter maintained, and an extended portion of the first outer cylindrical collar 14 is rotatably supported by the shaft frame 41 via the bearing section 53 by an outer peripheral surface of an upper support portion 14d that is an end portion of the extended portion. Moreover, a portion of an outer peripheral surface placed between the bearing section 51 and the bearing section 53 at the extended portion of the first outer cylindrical collar 14 is a gear fixation portion 14e (also an extended portion of the first-support portion 14b), and an inner peripheral surface of the shaft gear 31 is bonded and fixed to this gear fixation portion 14e. At the gear fixation portion 14e, a space capable of juxtaposing two shaft gears 31 is secured along the axis of rotation R of the spline shaft. However, in FIG. 2, the shaft gear 31 is fixed to an upper portion, in this figure, of the gear fixation portion 14e. Moreover, FIG. 2 shows a case where the shaft gear 31 is fixed to a lower portion of the gear fixation portion 14e by imaginary lines in the figure. Moreover, a gap is provided between an inner peripheral surface of the gear fixation portion 14e of the first outer cylindrical collar 14 and the outer peripheral surface of the spline shaft 11, with the gap assuring no contact between these members. As described above, with the shaft gear 31 fixed to the first outer cylindrical collar 14 at the gear fixation portion 14e, it is possible to rotate the first outer cylinder collar 14 by rotating the shaft gear 31, and further rotate the spline shaft 11 around the axis of rotation R by rotating the first spline nut 12 and the second spline nut 13, put in the integrated state, around the axis of rotation R.

In this case, a relationship in a plane among shaft gears 31, cogged belts 32 and driving gears 33 will be described here with reference to a schematic explanatory view shown in FIG. 3.

Figure 3:
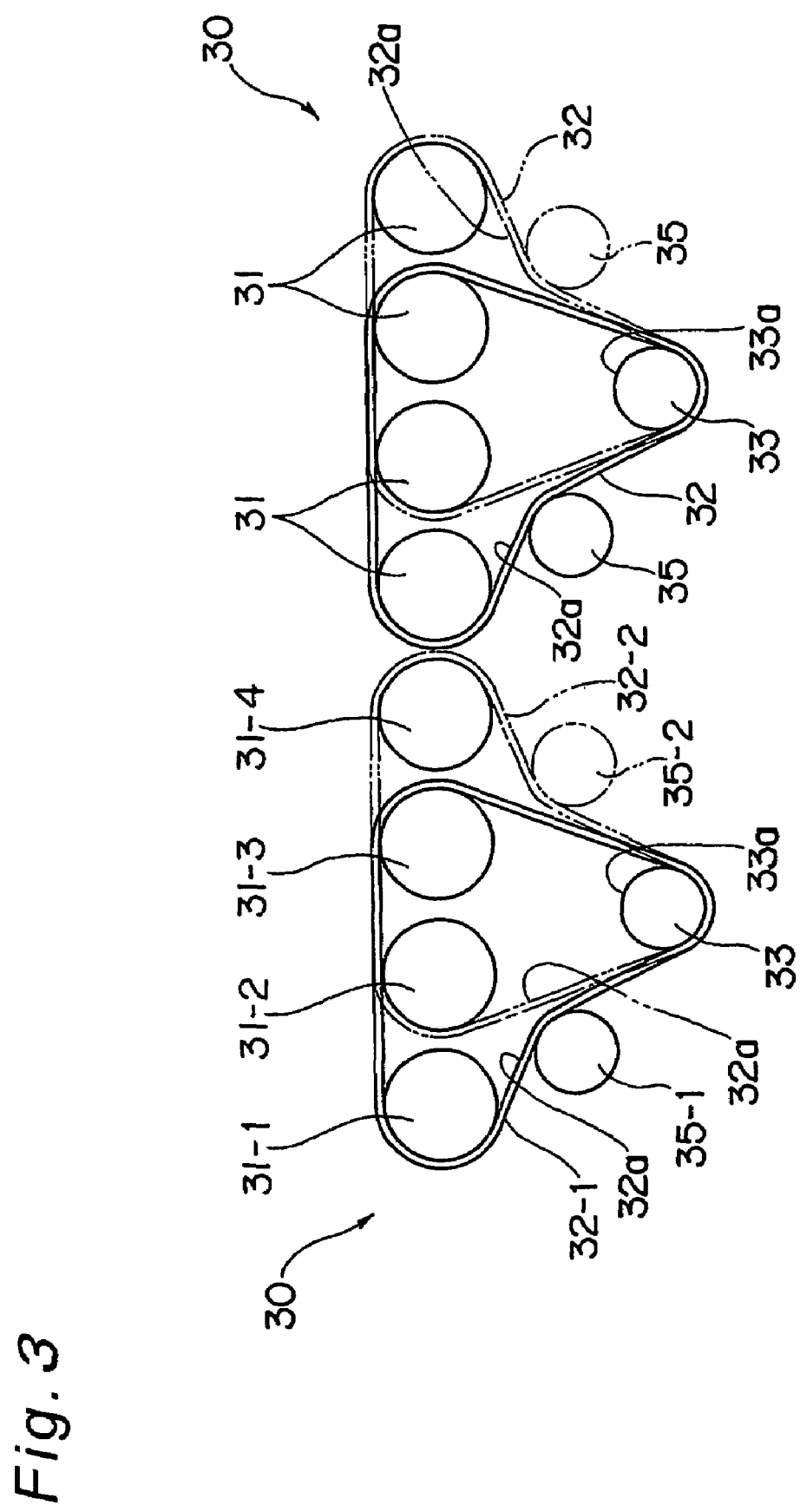
FIG. 3 is a schematic explanatory view showing a relationship of engagement among driving gears, shaft gears and cogged belts in a rotating unit of the head section of FIG. 1.

As shown in FIG. 3, the head section 100 is provided with two rotating units 30. Eight shaft gears 31, which are arranged mutually adjacently at specified intervals in a line, are grouped into groups of four on the left-hand side and four on the right-hand side in this figure, and the groups of the shaft gears 31 belong to respective rotating units 30. It is to be noted that two rotating units 30 are grouped into rotating unit 30 located on the left-hand side in the figure and rotating unit 30 located on the right-hand side in the figure. However, since the rotating units have similar structures, only the rotating unit 30 located on the left-hand side in the figure will be explained as a representative in the following description.

As shown in FIG. 3, in the rotating unit 30 located on the left-hand side in the figure, four shaft gears 31 are arranged at specified intervals in a line. The shaft gears 31 are assumed to be constituted of a first shaft gear 31-1 (one example of a first transmission gear section), a second shaft gear 31-2 (one example of a second transmission gear section), a third shaft gear 31-3 (one example of a third transmission gear section) and a fourth shaft gear 31-4 (one example of a fourth transmission gear section) in order from the left-hand side toward the right-hand side in the figure. Moreover, with regard to the first shaft gear 31-1 and the third shaft gear 31-3 of the shaft gears 31, these shaft gears are fixed to a fixation position of the shaft gears (i.e., a position located on an upper side in FIG. 2) indicated by a solid line in the gear fixation portion 14e of FIG. 2. On the other hand, with respect to the second shaft gear 31-2 and the fourth shaft gear 31-4, these shaft gears are fixed to a fixation position of the shaft gears (i.e., a position located on a lower side in FIG. 2) indicated by an imaginary line in the gear fixation portion 14e of FIG. 2.

Moreover, as shown in FIG. 3, the rotating unit 30 located on the left-hand side in the figure is provided with two cogged belts 32 of a first cogged belt 32-1 arranged on the left-hand side of this rotating unit, and a second cogged belt 32-2 arranged on the right-hand side of this rotating unit. The first cogged belt 32-1 and the second cogged belt 32-2 are engaged with one driving gear 33 by inner peripheral surfaces thereof. Further, the first cogged belt 32-1 is engaged with the first shaft gear 31-1 and the third shaft gear 31-3 by an inner peripheral surface thereof, while the second cogged belt 32-2 is engaged with the second shaft gear 31-2 and the fourth shaft gear 31-4 by an inner peripheral surface thereof.

As shown in FIG. 1, the driving gear 33 has teeth 33a, which are formed vertically in two rows so as to be engageable with the respective cogged belts 32. An upper row side driving gear 33b, which is located on an upper row side of the two rows, is engaged with the first cogged belt 32-1, while a lower row side driving gear 33c, which is located on a lower row side, is engaged with the second cogged belt 32-2. That is, as shown in FIG. 1, the first cogged belt 32-1 and the second cogged belt 32-2 have a relationship of mutually vertical arrangement. The first cogged belt 32-1 is arranged on an upper side in this figure, and the second cogged belt 32-2 is arranged on a lower side in the figure, so that the cogged belts 32 do not interfere with each other. It is to be noted that the first shaft gear 31-1, the third shaft gear 31-3 and the upper row side driving gear 33b are arranged at a same height of placement, while the second shaft gear 31-2, the fourth shaft gear 31-4 and the lower row side driving gear 33c are arranged at a same height of placement. Therefore, the first cogged belt 32-1 and the second cogged belt 32-2, which have the aforementioned mutually vertical arrangement, are arranged roughly parallel to each other.

Moreover, as shown in FIG. 3, a tension roller 35-1 is provided between the first shaft gear 31-1 and the driving gear 33 so as to consistently urge the first cogged belt 32-1 inwardly, thereby consistently applying a constant tension force to the first cogged belt 32-1 for retention of a firm engagement relationship among the first shaft gear 31-1, the third shaft gear 31-3, the upper row side driving gear 33b and the first cogged belt 32-1. Likewise, a tension roller 35-2 is provided between the fourth shaft gear 31-4 and the driving gear 33 so as to consistently urge the second cogged belt 32-2 inwardly, thereby consistently applying a constant tension force to the second cogged belt 32-2 for retention of a firm engagement relationship among the second shaft gear 31-2, the fourth shaft gear 31-4, the lower row side driving gear 33c and the second cogged belt 32-2.

As shown in FIGS. 1, 2 and 3, a rotational driving force or a tension force is applied to the shaft gears 31 by the cogged belts 32. However, the first outer cylindrical collar 14, which fixes the shaft gears 31 and is surely supported by the bearing sections 51 and 53 at both upper and lower ends of the gear fixation portion 14e, scarcely receives influence of the rotational driving force or the tension force.

With the rotating unit 30 having the above-mentioned structure, by rotatively driving the rotating drive motor 34 in either a forward or reverse rotational direction, the driving gears 33 are rotatively driven in the above-mentioned rotational direction via the driving shaft 34a, and the first cogged belt 32-1 engaged with the upper row side driving gear 33b and the second cogged belt 32-2 engaged with the lower row side driving gear 33c are concurrently driven to run along the above-mentioned rotational direction. By this operation, the first shaft gear 31-1 and the third shaft gear 31-3 engaged with the first cogged belt 32-1 are concurrently driven to rotate in the above-mentioned rotational direction, while the second shaft gear 31-2 and the fourth shaft gear 31-4 engaged with the second cogged belt 32-2 are concurrently driven to rotate in the above-mentioned rotational direction. As a result, in the shaft sections 10 (one example of the first shaft section through the fourth shaft section) corresponding to the four shaft gears 31, the first spline nut 12 and the second spline nut 13 are rotatively driven around respective axes of rotation R via respective first outer cylindrical collars 14 fixed to respective shaft gears 31, thereby allowing respective spline shafts 11 to concurrently rotate around the axes of rotation R.

(Elevation Unit)

Structure of the elevation unit 20 will be described in detail next. It is to be noted that the eight elevation units 20 provided for the head section 100 have similar structures.

Therefore, in the following description of the elevation units 20, the structure of one elevation unit 20 out of these elevation units will be described unless specially mentioned.

First of all, as shown in FIG. 1, the elevation unit 20 is provided with a ball screw shaft 21, that is one example of the ball screw shaft section supported by the elevation frame 42, provided for the head frame 40, rotatably around axis of rotation S, arranged roughly parallel to axis of rotation R of the spline shaft 11. The elevation unit 20 is further provided with an elevation drive motor 22 that is one example of a rotating drive section, which is fixed to an upper end portion, in this figure, of the ball screw shaft 21 and rotates the ball screw shaft 21 in either a forward or reverse rotational direction around axis of rotation S, and an elevation nut section 23, which is meshed with the ball screw shaft 21 and moved up and down along axis of rotation S by rotation of the ball screw shaft 21. Moreover, the elevation unit 20 is further provided with an elevation bar 24, that is one example of an engagement member formed of a roughly L-figured rigid body, which has one end fixed to the elevation nut section 23 and is moved up and down integrally with ascent and descent of the elevation nut section 23. Moreover, the elevation bar 24 is arranged so that end portion 24a, which is another end of this elevation bar 24, is engaged with an upper portion of the spline shaft 11 via two bearing sections 25 fixed apart from each other at the upper portion of the spline shaft 11. Moreover, the end portion 24a of this elevation bar 24 has a roughly U-figured shape. The end portion 24a of the elevation bar 24 and an outer ring portion of each the two bearing sections 25 are fixed to each other so as to hold the two bearing sections 25 inside the roughly U-figured shape, whereby engagement of the elevation bar 24 with the spline shaft 11 is achieved. Moreover, the two bearing sections 25 are each fixed to the upper portion of the spline shaft 11 by an inner ring portion, and therefore, the engagement of the elevation bar 24 with the spline shaft 11 does not hinder rotation of the spline shaft 11 around axis of rotation R.

Moreover, as shown in FIG. 1, an annular spring receiving section 26 is fixed to a lower surface of the bearing section 25 located on a lower side in this figure, from among the two bearing sections 25 fixed to the spline shaft 11, and an upper end of a spring 27 arranged in an annular shape on an outer periphery of the spline shaft 11 is attached to a lower end of this spring receiving section 26. Further, as shown in FIG. 1, an annular stepped portion 14f is formed on an inner peripheral surface of the gear fixation portion 14e of the first outer cylindrical collar 14 of the shaft section 10, and a lower end of the spring 27 is attached to this stepped portion 14f.

This spring 27 plays a role of supporting the spline shaft 11 supported by the first spline nut 12 and the second spline nut 13 elevatably along axis of rotation R so that the spline shaft does not fall due to its own weight or the like, and consistently urging upward the spline shaft 11 so as to put engagement positions of the elevation bar 24 and the spline shaft 11 into a state in which they are more securely retained.

With the elevation unit 20 having the above-mentioned structure, the elevation nut section 23 meshed with the ball screw shaft 21 can be moved up or down along axis of rotation S by driving the elevation drive motor 22 to rotate in either a forward or reverse rotational direction to rotate the ball screw shaft 21 around axis of rotation S in the rotational direction. Further, the elevation bar 24 fixed to this elevation nut section 23 is to be moved up or down along axis of rotation S together with the elevation nut section 23. Due to the engagement of this elevation bar 24 with the spline shaft 11, the spline shaft 11 can be moved up or down along axis of rotation R in synchronization with ascent or descent of the elevation nut section 23. This spline shaft 11 is moved up or down along inner peripheral surfaces of the first spline nut 12 and the second spline nut 13. It is to be noted that an amount of ascent or descent of the elevation nut section 23 can directly be an amount of ascent or descent of the spline shaft 11 by a state of secure engagement of the end portion 24a of the elevating bar 24 with the spline shaft 11. That is, by controlling a rotational drive amount of the elevation drive motor 22, an amount of elevation of the spline shaft 11 can be controlled. It is to be noted that the end portion 24a of the elevation bar 24, which is to move up and down the spline shaft 11 via the bearing section 25 located on the lower side, exerts no influence on rotational operation of the spline shaft 11.

Moreover, when the ball screw shaft 21 is rotated around axis of rotation S thereof by a rotatively driven elevation drive motor 22 in each elevation unit 20, the elevation nut section 23 receives a rotational moment around axis of rotation S, and the elevation bar 24 fixed to this elevation nut section 23 also similarly receives a rotational moment. In the above-mentioned case, due to the fact that the end portion 24a of the elevation bar 24 has a roughly U-figured shape, this rotational moment is to be transmitted to the spline shaft 11 via each bearing section 25. This spline shaft 11, which is formed so as to have rigidity resistible to this rotational moment, is able to restrict rotation around axis of rotation S of the elevation bar 24 and the elevation nut section 23. Therefore, the elevation bar 24 and the elevation nut section 23 have their movement in a rotational direction consistently restricted only by engagement of the elevation bar 24 with the spline shaft 11, and the elevation nut section 23 can be moved up and down along the axis of rotation S by rotation of the ball screw shaft 21.

(Assembling Procedure of the Shaft Section)

A procedure for assembling components in the shaft section 10 of the head section 100 having the above-mentioned construction will be described next.

First of all, in FIG. 2, the first nut fixation portion 14a of the first outer cylindrical collar 14 is fastened and fixed to the outer peripheral surface of the first spline nut 12 in a state in which the first spline nut 12 and the second spline nut 13 are assembled to the spline shaft 11, and the second nut fixation portion 15a of the second outer cylindrical collar 15 is similarly fastened and fixed to the outer peripheral surface of the second spline nut 13. Further, the inner peripheral surface of the intermediate collar 16 is bonded and fixed to each of a portion of the outer peripheral surface of the first spline nut 12 exposed from the first outer cylindrical collar 14 and to a portion of the outer peripheral surface of the second spline nut 13 exposed from the second outer cylindrical collar 15, thereby joining the first spline nut 12 to the second spline nut 13.

As described above, the first support portion 14b located in a position where the first outer cylindrical collar 14 is supported by the bearing section 51, and the second support portion 15b located in a position where the second outer cylindrical collar 15 is supported by the bearing section 52, are concurrently processed in a state in which the spline shaft 11, the first spline nut 12, the second spline nut 13, the first outer cylindrical collar 14, the second outer cylindrical collar 15 and the intermediate collar 16 are assembled together. The nozzle attaching portion 11a, which is a portion to be detachably equipped with the suction nozzle 2, of the spline shaft 11 is concurrently processed. Further, the upper support portion 14d located in a position (also the upper end portion of the first outer cylindrical collar 14) where the first outer cylindrical collar 14 is supported by the bearing section 53 is also concurrently processed. Processing of the above-mentioned portions is performed in a state in which the spline shaft 11 is rotated around axis of rotation R so that axes of rotation of the above-mentioned portions coincide with axis of rotation R of the spline shaft 11 by, for example, finely cutting outer peripheral surfaces and end portions of the above-mentioned portions.

After effecting the processing as described above, the shaft gear 31 is inserted into and fixed to the gear fixation portion 14e of the first outer cylindrical collar 14, and this assembly is inserted into the shaft frame 41 in a state in which the spline shaft 11, the first spline nut 12, the second spline nut 13, the first outer cylindrical collar 14, the second outer cylindrical collar 15, the intermediate collar 16 and the shaft gear 31 are assembled together. The shaft section 10 is supported by the shaft frame 41 via the bearing sections 51, 52 and 53. The shaft section 10 can thus be assembled and supported by the shaft frame 41. Moreover, with regard to production accuracy (i.e., allowance limits of error of design dimensions and work dimensions) of components in the shaft section 10, the first outer cylindrical collar 14, the second outer cylindrical collar 15 and the intermediate collar 16 are produced within an accuracy of about 20 μm. As a result of effecting processing in a state in which the components produced with the above-mentioned production accuracy are assembled together, a misalignment (i.e., concentricity) of axis of rotation R of the spline shaft 11 with respect to support sections of the bearing sections 51, 52 and 53 can be restrained to about 10 to 30 μm.

The shaft gear 31 is to be fixed to the gear fixation portion 14e of the first outer cylindrical collar 14 by its inner peripheral surface. Concentricity of the axis of rotation of the shaft gear 31 with respect to axis of rotation R of the spline shaft 11 can be within a dimensional error of about 20 μm in terms of production accuracy with respect to the inner peripheral surface of the shaft gear 31 and the gear fixation portion 14e of the first outer cylindrical collar 14.

(A Component Placement Operation by the Head Section)

Next, an operation of sucking and holding the electronic component 1 by the head section 100 having the aforementioned construction and attached to the X-Y robot of the aforementioned electronic component placing apparatus (not shown), and placing the electronic component 1, sucked and held, onto a mounting position of the component on a circuit board held on the machine base in the electronic component placement apparatus, will be described next.

First of all, the head section 100 is moved along a surface of the circuit board by the X-Y robot so that the suction nozzles 2 of the head section 100 are located above an electronic component supply section in which a plurality of electronic components 1 are ejectably supplied in the electronic component placing apparatus.

Subsequently, in each of the elevation units 20 of the head section 100 of FIG. 1, the elevation drive motor 22 is rotatively driven in either a forward or reverse rotational direction with its rotational drive amount controlled, thereby moving down the elevation nut section 23 along axis of rotation S via the ball screw shaft 21. By this operation, the elevation bar 24 is moved down in each of the elevation units 20, thereby depressing downward the bearing section 25 engaged with its end portion 24a. By this operation, the spring 27 is contracted, and the spline shaft 11 is moved down along axis of rotation R while being slid on the inner peripheral surface of the first spline nut 12 and the second spline nut 13. In each of the shaft sections 10, an end portion of the suction nozzle 2 comes into contact with an upper surface of electronic component 1, and the suction nozzle 2 sucks and holds the electronic component 1. Subsequently, in each of the elevation units 20, a rotational direction of the elevation drive motor 22 is reversed, and the elevation bar 24 is moved up. In accordance with ascent of this elevation bar 24, the spline shaft 11 is moved up along axis of rotation R, and the electronic component 1 sucked and held by the suction nozzle 2 is moved up and removed from the electronic component supply section. At this time, since the spline shaft 11 is consistently urged upward by the spring 27 in each of the elevation units 20, the spline shaft 11 is moved up while a position of elevation of the spline shaft 11 is restricted by the end portion 24a of the elevation bar 24.

There may be either a case where the suction nozzles 2 are concurrently moved up and down in the head section 100 to suck and hold and remove the electronic components 1, or a case where the suction nozzles 2 are successively moved up and down to suck and hold and remove the electronic components 1.

Subsequently, the head section 100 is moved by the X-Y robot upwardly of the circuit board in the electronic component placement apparatus. During this movement process, by picking up an image of the electronic components 1 sucked and held by the suction nozzles 2 of the head section 100 (by picking up the image by, for example, a camera provided for the machine base of the electronic component placement apparatus or a camera provided for the head section 100 (neither one is shown) or the like), a sucked-and-held posture of electronic component 1 held by each of the suction nozzles 2 is recognized. On the basis of a recognition result of each sucked-and-held posture, the sucked-and-held posture is corrected so that the sucked-and-held posture coincides with a placed posture (posture of placement in the placement position), and the electronic components 1 are to be placed in respective placement positions on the circuit board.

For example, a displacement in the rotational direction around axis of rotation R may occur between the sucked-and-held posture and the placement posture of the electronic component 1. In such a case, this displacement can be corrected (hereinafter referred to as a θ correction) by rotatively moving (i.e., rotating by an angle of θ) the suction nozzle 2 around axis of rotation R.

A procedure for executing the θ correction in the head section 100 will be described in concrete. First of all, the θ correction is executed sequentially from the electronic component 1 sucked and held by the suction nozzle 2 that firstly performs a placement operation of the electronic component 1 from among the eight suction nozzles 2 provided for the head section 100. For example, when the shaft gear 31 attached to the shaft section 10 equipped with this suction nozzle 2 is the shaft gear 31-1 shown in FIG. 3, the rotating drive motor 34 in the rotating unit 30 located on the left-hand side in this figure is first rotatively driven in either a forward or reverse rotational direction with its rotational drive amount controlled on a basis of a rotational angle to be subjected to θ correction, thereby driving the first cogged belt 32-1 to run along the rotational direction via the upper row side driving gear 33b. By this operation, the first shaft gear 31-1 is rotated by the rotational angle in the rotational direction around the axis of rotation thereof. At this time, due to structure of the rotating unit 30, the second shaft gear 31-2, the third shaft gear 31-3 and the fourth shaft gear 31-4 are concurrently rotated by the same rotational angle in the same rotational direction.

In accordance with the above-mentioned rotation of the first shaft gear 32-1, the first outer cylindrical collar 14, integrally fixed to the gear fixation portion 14e of the inner peripheral surface of the first shaft gear 32-1 is rotatively driven. Further, the first outer cylindrical collar 14, the second outer cylindrical collar 15, the intermediate collar 16, the first spline nut 12 and the second spline nut 13, which are put in a mutually integrated state, are rotatively driven around axis of rotation R, and the spline shaft 11 is also rotated around axis of rotation R by the aforementioned angle in the rotational direction. By this operation, the suction nozzle 2 equipped for the nozzle attaching portion 11a of the spline shaft 11 is rotatively moved around axis of rotation R by the aforementioned rotational angle, thereby effecting the θ correction of the electronic component 1.

At this time, as described above, the nozzle attaching portion 11a, the first support portion 14b, the second support portion 14c and the upper support portion 14d are concurrently processed in a state in which the spline shaft 11, the first spline nut 12, the second spline nut 13, the first outer cylindrical collar 14, the second outer cylindrical collar 15 and the intermediate collar 16 are assembled together. Therefore, concentricity of axes of rotation is improved, and θ correction can be executed with high accuracy.

In the rotating unit 30, the suction nozzle 2, by which a placement operation of the electronic component 1 is to be executed next, is processed i.e., one shaft gear 31 is selected from among the second shaft gear 31-2, the third shaft gear 31-3 and the fourth shaft gear 31-4, and θ correction is executed according to a similar procedure.

Moreover, as shown in FIG. 3, the head section 100 is provided with the two rotating units 30 that have the same structure. Therefore, θ correction can be concurrently executed also in the rotating unit 30 located on the right-hand side in this figure while executing θ correction in the rotating unit 30 located on the left-hand side in the figure. By thus concurrently executing θ correction in the head section 100, a time for executing the θ correction for all the suction nozzles 2 can be reduced.

Subsequently, a positional alignment of the suction nozzle 2, by which a placement operation is to be performed first from among the suction nozzles 2 provided for the head section 100, with a placement position of the circuit board is performed by the X-Y robot. After this positional alignment, the elevation drive motor 22 is driven to rotate in either a forward or reverse rotational direction, with its rotational drive amount controlled, in the elevation unit 20 corresponding to the suction nozzle 2, thereby moving down the elevation nut section 23 along axis of rotation S via the ball screw shaft 21. By this operation, the elevation bar 24 is moved down to depress downward the bearing sections 25 engaged with the end portion 24a thereof. By this operation, the spring 27 is contracted, and the spline shaft 11 is moved down along axis of rotation R while being slid on the inner peripheral surfaces of the first spline nut 12 and the second spline nut 13. Subsequently, a lower surface of the electronic component 1 held by the suction nozzle 2 comes into contact with a placement position of the circuit board. In the placement position of the circuit board, a bonding material of solder or the like is preparatorily supplied, and the lower surface of the electronic component 1 is further pressed against the bonding material. In this state, descent by the elevation unit 20 is stopped, and sucking and holding of the electronic component 1 by the suction nozzle 2 is released. Subsequently, the spline shaft 11 is moved up by the elevation unit 20 to move up the suction nozzle 2, and the electronic component 1 is placed in the placement position of the circuit board. Subsequently, an operation similar to the above will be repetitively executed for other suction nozzles 2 to place respective electronic components 1 onto the circuit board.

An operation of placing a plurality of electronic components 1 on the circuit board can thus be executed by the head section 100.

Figure 7:
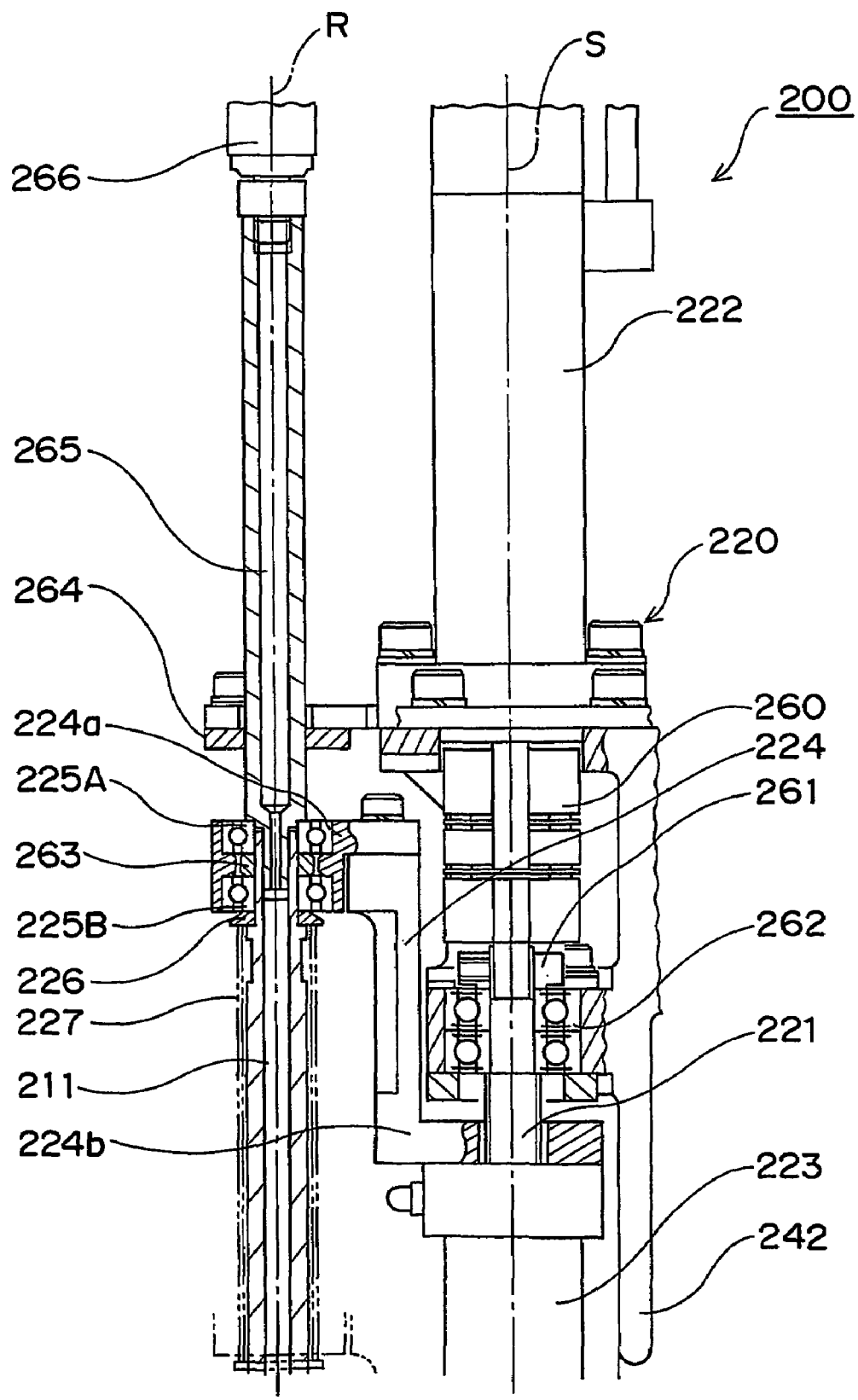
FIG. 7 is a sectional view of part of a head section according to a modification example of the first embodiment.

In this case, FIG. 7 shows a schematic sectional view of part of a head section 200 according to a modification example of the head section of the present first embodiment, and structure of a portion to be joined to the elevation unit and the spline shaft will be described in detail with reference to FIG. 7. It is to be noted that a basic structure of the head section 200 described below is roughly similar to that of the head section 100 shown in FIG. 1, and a detailed structural section is more concretely shown. Moreover, similarly to the head section 100, the head section 200 is provided with eight spline shafts (or suction nozzles) and eight elevation units corresponding independently to the spline shafts. However, since they have a mutually identical structure, a relationship between one set of spline shafts and the elevation units thereof will be explained in the following description.

As shown in FIG. 7, elevation unit 220 provided for the head section 200 is provided with a ball screw shaft 221 that is one example of a ball screw shaft section rotatably supported by an elevation frame 242 around axis of rotation S (H shaft) arranged in the same direction (i.e., a perpendicular direction) as that of axis of rotation R of spline shaft 211. In concrete, the ball screw shaft 221 provided with an axial center thereof as axis of rotation S has both its end portions fixed to the elevation frame 242 (by using, for example, a fixing nut section 261 or the like) via bearing sections (only bearing section 262 for fixing an end portion on an upper side is shown in this figure). Moreover, the end portion on the upper side of the ball screw shaft section 221 is joined to an elevation drive motor 222 via a coupling 260. By being rotatively driven around axis of rotation S as a consequence of transmission of a rotating drive, by this elevation drive motor 222, to the ball screw shaft 221 via the coupling 260, an elevation nut section 223 meshed with the ball screw shaft 221 can be moved up and down. Moreover, elevation unit 220 is provided with an elevation bar 224, which has one end fixed to an elevation nut section 223 and is one example, of an engagement member formed of a rigid body having a roughly L-figured shape moved up and down integrally with ascent and descent of the elevation nut section 223. Moreover, this elevation bar 224 is formed by fastening a joint bracket-B 224b, that has one end fixed to the elevation nut section 223, to a joint bracket-A 224a engaged with the spline shaft 211 by virtue of, for example, screwing.

Moreover, as shown in FIG. 7, the spline shaft 211, of which the axial center is arranged so as to roughly coincide with its axis of rotation R, is rotatably supported by a head frame (not shown) via (first and second) spline nuts. An upper end side of the spline shaft 211 is a portion to be engaged with the joint bracket-A 224a, and engagement between the joint bracket-A 224a and the spline shaft 211 is achieved via a bearing section-A 225A and a bearing section-B 225B attached to an outer periphery of the spline shaft 211.

More in detail, an end portion of the joint bracket-A 224a has a roughly ring-like shape. By fixing the roughly ring-shaped inside of the joint bracket-A 224a to outer ring portions of the bearing section-A 225A and the bearing section-B 225B so that the bracket holds both the bearing section-A 225A and the bearing section-B 225B inside the roughly ring-like shape, the aforementioned engagement is achieved. Moreover, inner ring portions of the bearing section-A 225A and the bearing section-B 225B are fixed to an outer peripheral surface of the spline shaft 211, and a spacer 263 that is arranged so as to bury the inner ring portions of the bearing sections is further fixed to an outer peripheral surface of the spline shaft 211. It is to be noted that a gap is provided between the joint bracket-A 224a and the spacer 263, with the gap assuring no contact between these members.

Moreover, an annular spring receiving section 226 is fixed to a lower portion of the inner ring of the bearing section-B 225B, and an upper end of a spring 227 is attached to a lower end of this spring receiving section 226. It is to be noted that a lower end of the spring 227 is attached to an annular stepped portion formed on an inner peripheral surface of a gear fixation portion of a first outer cylindrical collar of a shaft section (not shown). With the above-mentioned spring 227 or the like provided, the spline shaft 211, whose own weight is supported by the elevation unit 220 via the elevation bar 224, is supported by the spring 227 instead of by the elevation unit 220 when, for example, electrification of elevation drive motor 222 of the elevation unit 220 is interrupted (e.g., during power failure or the like), thereby allowing this spline shaft 211 to be prevented from falling. A reason why the joint bracket-A 224a and the joint bracket-B 224b are fastened to each other by screwing in the elevation bar 224 is for fine adjustment of positions of axes of rotation R and S in the head section 220.

Moreover, an upper shaft 265 is arranged above the spline shaft 211 on axis of rotation R, and a lower portion of this upper shaft 265 is integrally fixed to an upper end of the spline shaft 211 by fastening by screwing or the like. Moreover, a metal bearing section 264 for guiding ascent and descent of the upper shaft 265, which is moved up and down integrally with the spline shaft 211, is formed on the left-hand side in FIG. 7 in an upper portion of elevation frame 242. Moreover, an air joint 266, which is a joined portion to be joined to a vacuum unit, is provided at an upper end of the upper shaft 265. The upper shaft 265 and the spline shaft 211 have hollow holes, which are both formed along respective axial centers and mutually communicate, thereby allowing vacuum to reach an end of a suction nozzle from a vacuum unit via air joint 266 and the hollow holes, and thereby allowing the end portion of the suction nozzle to suck and hold an electronic component.

According to the construction and function of the above-mentioned head section 200, the elevation nut section 223 can be moved up and down in the elevation unit 220 by rotatively driving the elevation drive motor 222 and rotating the ball screw shaft 221 around axis of rotation S via coupling 260. With ascent of this elevation nut section 223, the elevation bar 224 fixed to the elevation nut section 223 is also moved up and down integrally with the elevation nut section 223, and an elevating operation of the spline shaft 211 along axis of rotation R can be performed via the bearing section-A 225A and the bearing section-B 225B.

Figure 4:
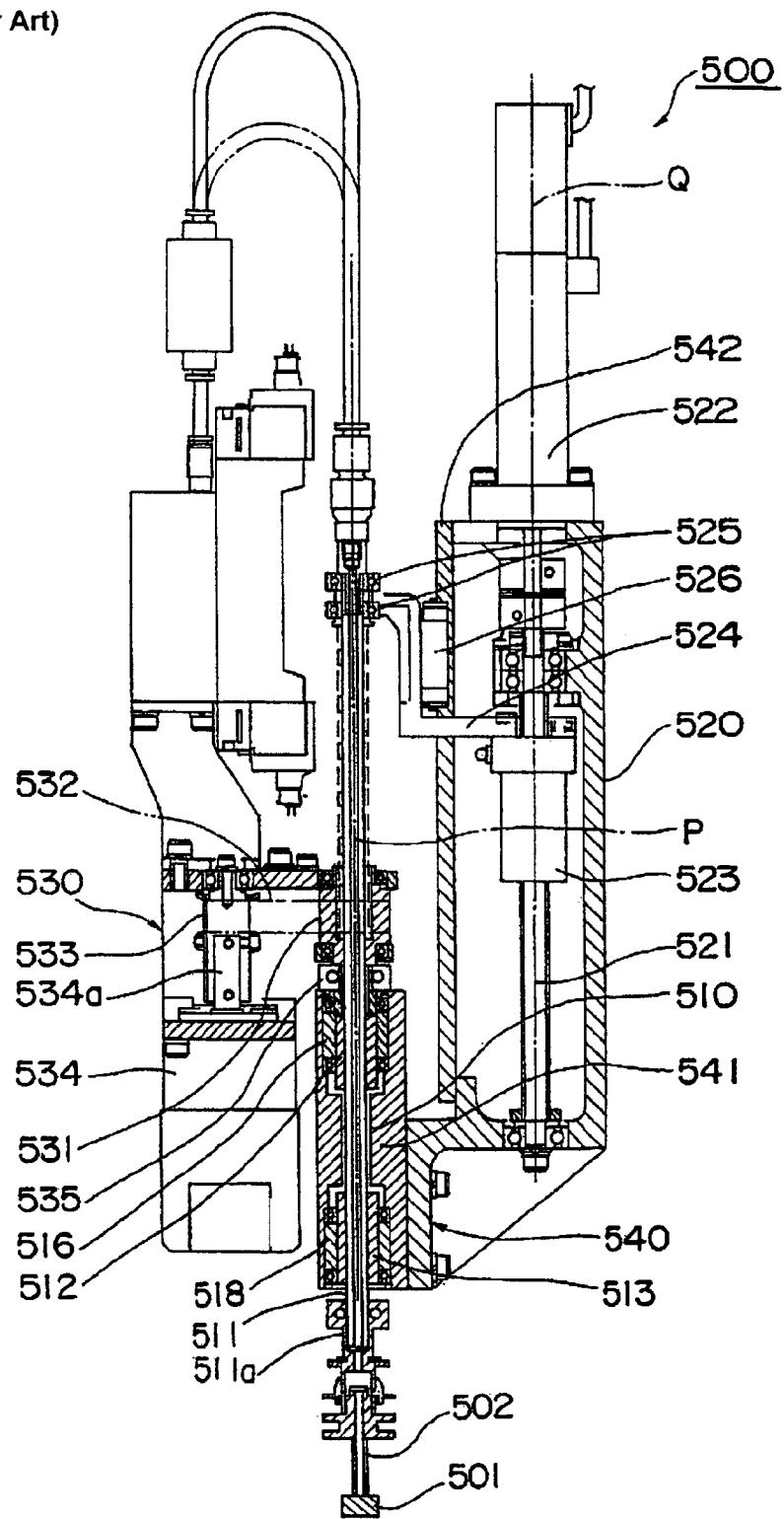
FIG. 4 is a sectional view of a conventional head section.
Figure 5:
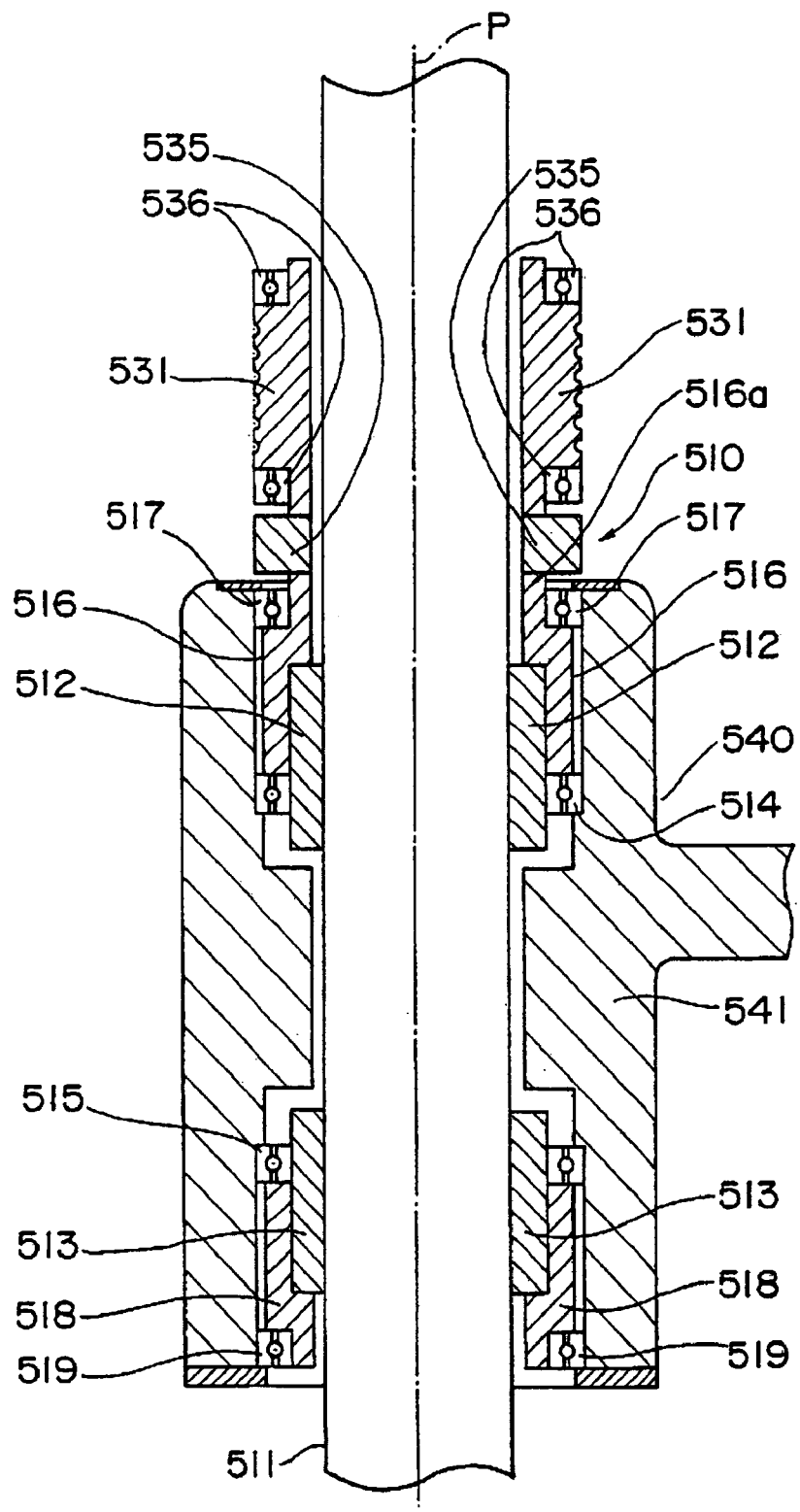
FIG. 5 is a partially enlarged schematic sectional view of a shaft section in the conventional head section.
Figure 6:
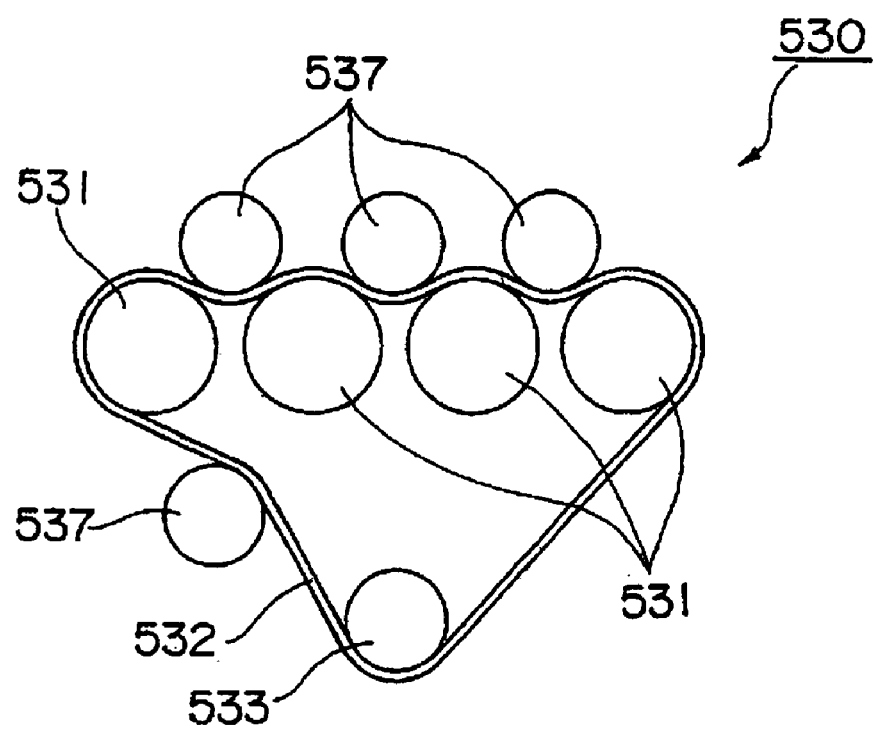
FIG. 6 is a schematic explanatory view showing a relationship of engagement among a driving gear, shaft gears and a cogged belt in a rotating unit of the conventional head section.

In this elevating operation, the elevation nut section 223 is to receive a reactive force generated when the ball screw shaft 221 is rotated by the elevation drive motor 222. In a conventional construction of an elevation unit that employs a ball screw shaft and an elevation nut section, there is a general practice of restricting (guiding) a pivot by a reactive force of the elevation nut section by using an LM guide (e.g., LM guide 526 of FIG. 4) or the like in order to resist such a reactive force. In contrast to this, an embodiment of the present modified example adopts a structure that employs two bearing sections of the bearing section-A 225A and the bearing section-B 225B in an upper portion of the spline shaft 211, thereby providing a construction resisting the reactive force by the spline shaft 211 itself. With this arrangement, an LM guide, which has been employed in the conventional construction, is made unnecessary. This allows a gap between the spline shaft 211 and the ball screw shaft 221 (i.e., a gap between axis of rotation R and axis of rotation S) to be shortened, thereby allowing downsizing of the head section 200 to be achieved.

Moreover, in the construction of the above-mentioned present embodiment, the spline shaft 211 is required to have a mechanical rigidity sufficient for resisting a reactive force. This required mechanical rigidity is sometimes higher than mechanical rigidity required for mounting an electronic component with high accuracy. Therefore, the present embodiment contributes to a substantial improvement of rigidity of the spline shaft 211 by providing metal bearing section 264 for elevatably supporting (guiding) the upper shaft 265 integrated with the spline shaft 211 without increasing a diameter of the spline shaft 211. There can be considered a technique for providing one more set of spline nuts for elevatably rotatably supporting the spline shaft 211 instead of the above-mentioned technique for improving rigidity. However, this technique has a problem in that the spline shaft 211 is sometimes unable to move up and down or rotate when its axial center is slightly displaced with respect to axis of rotation R due to a reactive force received by the spline shaft 211, errors in producing and assembling the spline shaft and the like, and therefore, it cannot be said that this technique is a preferable technique. In the present embodiment, for example, a gap of about 30 to 50 μm is provided between the metal bearing section 264 and the peripheral surface of the upper shaft 265 in order to prevent in advance occurrence of the above-mentioned problem in the metal bearing section 264.

(Effects of the First Embodiment)

According to the aforementioned first embodiment, the following various effects can be obtained.

First of all, the first outer cylindrical collar 14 and the second outer cylindrical collar 15 are fixed by the first nut fixation portion 14a and the second nut fixation portion 15a, respectively, to the outer peripheral surface of the first spline nut 12 and the second spline nut 13 that are arranged apart from each other in each of the shaft sections 10 of the head section 100, and are able to elevatably support the spline shaft 11 along axis of rotation R, with the inner peripheral surface of the intermediate collar 16 being bonded and fixed. With this arrangement, the two spline nuts, i.e. first spline nut 12 and the second spline nut 13, can be joined to each other and put into an integrated body.

Further, the two spline nuts put into the integrated body can be rotatably supported around axis of rotation R by the shaft frame 41 via the two bearing sections 51 and 52 in the first support portion 14b of the first outer cylindrical collar 14 and the second support portion 15b of the second outer cylindrical collar 15. That is, the two spline nuts can be rotatably supported by the two bearing sections 51 and 52, and an amount of bearing sections to be placed for supporting the spline nuts in each of the shaft sections 10 can be reduced.

For example, although each shaft section 510 is provided with two spline nuts similarly to the head section 100 of the first embodiment in the conventional head section 500, four bearing sections are attached to support the two spline nuts. However, in the head section 100 of the first embodiment, the amount of bearing sections to be placed can be reduced, and this allows assembling of the shaft sections 10 in the head section 100 to be facilitated and allows a production cost of the head section 100 to be reduced. Moreover, since the amount of bearing sections to be placed is also reduced, positional alignment of axes of rotation R of the spline shafts 11 with an axis of rotation of the bearing sections (also the axes of rotation of the first outer cylindrical collar 14 and the second outer cylindrical collar 15 in the first embodiment) can be facilitated (i.e., places to be subjected to positional alignment can be reduced). Therefore, a quantity of displacement due to rotation of the suction nozzle 2 in the shaft section 10 can be reduced, and rotational accuracy can be improved.

Moreover, instead of supporting the spline nuts directly by the outer peripheral surfaces thereof by the shaft frame 41 via the bearing sections, the stepped portion 14c is formed between the first support portion 14b and the first nut fixation portion 14a so that the outside diameter of the portion 14b becomes approximately equal to or preferably smaller than the inside diameter of the portion 14a in the first outer cylindrical collar 14, and the stepped portion 15c is formed between the second support portion 15b and the second nut fixation portion 15a so that the outside diameter of the portion 15b similarly becomes approximately equal to or preferably smaller than the inside diameter of the portion 15a in the second outer cylindrical collar 15. By supporting the two spline nuts via the first support portion 14b, the second support portion 15b and the two bearing sections 51 and 52, the inside diameter of the bearing sections can be made approximately equal to or smaller than the outside diameter of the spline nuts while reducing the amount of the bearing sections to be placed.

As described above, when the inside diameter of the bearing section can be reduced, the outside diameter of each shaft section 10 can be reduced, and an arrangement interval between the spline shafts 11 provided for the head section 100 can be narrowed, thereby allowing a downsized head section 100 to be provided.

Conversely, when the outside diameter of the shaft section 10 is not reduced, the outside diameter of the spline shaft 11 can be increased without changing the outside diameter of the shaft section 10, and rigidity of the spline shaft 11 can be improved. In such a case, generation of displacement or the like of axis of rotation R of the spline shaft 11 can be restrained by the rigidity even when, for example, an external force is applied to the spline shaft 11 during replacement of the suction nozzle 2 or another case, and a head section having a higher rotational accuracy can be provided.

Moreover, by cutting the outer peripheral surfaces of the first support portion 14b in position where the first outer cylindrical collar 14 is supported by the bearing 51, the second support portion 15b in a position where the second outer cylindrical collar 15 is supported by the bearing 52, and the upper support portion 14d in a position where the first outer cylindrical collar 14 is supported by the bearing section 53 while rotating the spline shaft 11 around axis of rotation R in a state in which the spline shaft 11, the first spline nut 12, the second spline nut 13, the first outer cylindrical collar 14, the second outer cylindrical collar 15 and the intermediate collar 16 are integrally assembled in attaching each shaft section 10 to the head section 100, an axis of rotation of portions that have undergone machining can be made to roughly coincide with the axis of rotation of the spline shaft 11 with high accuracy. Furthermore, the shaft section 10 can be rotatably supported by the shaft frame 41 via the bearing sections 51, 52 and 53 by inserting the shaft section 10 assembled in the above-mentioned state into the shaft frame 41, and a head section 100 having a high rotational accuracy can be provided.

As a concrete example, although components of the shaft section 510 are produced with a production accuracy of about 10 μm in the conventional head section 500, displacement of the axes of rotation further occurs during assembly, and a concentricity of about 50 μm to 70 μm is achieved after this assembling. On the other hand, in the head section 100 of the first embodiment, cutting is performed after the components are assembled even if the first outer cylindrical collar 14, the second outer cylindrical collar 15 and the intermediate collar 16 are produced with a production accuracy of about 20 μm. Therefore, a concentricity of about 10 to 30 μm can be finally obtained.

Moreover, dissimilarly to the conventional case where a shaft gear is attached to the outer cylindrical collar 516 via the coupling 535 in each of the shaft sections 10, the shaft gear 31 is directly fixed to the gear fixation portion 14e of the first outer cylindrical collar 14 in a state in which concentricity is improved as described above. Therefore, concentricity of the axis of rotation of the shaft gear 31 with respect to axis of rotation R of the spline shaft 11 can be improved.

Moreover, dissimilarly to the conventional case where four shaft gears 531 are engaged with one another inside one cogged belt 532 in each of the rotating units, the first cogged belt 32-1 and the second cogged belt 32-2 are provided as two cogged belts in each of the rotating units 30, with the first cogged belt 32-1 being engaged with the first shaft gear 31-1 and the third shaft gear 31-3, and the second cogged belt 32-2 being engaged with the second shaft gear 31-2 and the fourth shaft gear 31-4. Therefore, areas of engagement of the four shaft gears 31 can be made uniform in a state in which areas of engagement of the cogged belts with the shaft gears 31 are sufficiently secured. With this arrangement, a deviation in rotational accuracy, which has been generated by deviation in an area of engagement, can be prevented. Further, by sufficiently securing the areas of engagement, each of the shaft gears 31 can reliably be driven to rotate, and the suction nozzles 2 can be rotated with high rotational accuracy.

As a concrete example, in contrast to the fact that rotational accuracy of θ-rotation by the rotating unit 530 is about 0.2 degrees in the conventional head section 500, rotational accuracy of θ-rotation by the rotating unit 30 can be improved to at most 0.01 degrees in the head section 100 of the first embodiment.

In each of the elevation units 20, movement of the elevation bar 24 and the elevation nut section 23 in a rotational direction thereof is consistently restricted by only engagement between the elevation bar 24 and the spline shaft 11, and the elevation nut section 23 can be moved up and down along axis of rotation S by rotation of the ball screw shaft 21. However, the above-mentioned structure can be provided by forming large the outside diameter of the spline shaft 11 by the support structure with outside diameters of the bearing sections 51 and 52 maintained in the shaft section 10 for improvement of rigidity (i.e., strength) as described by the aforementioned effects. Therefore, in the support structure in which the outside diameter of the spline shaft 511 cannot be formed large (i.e., for a reason that an entire head section becomes disadvantageously large if an external shape is formed large) as in the conventional head section 500, the LM guide 526, which has been needed to receive a rotational moment transmitted from the elevation nut section 523 to the spline shaft 511 via the elevation bar 524, can be made unnecessary in the head section 100 of the first embodiment. With this arrangement, a dimension between axis of rotation R of the spline shaft 11 and axis of rotation S of the ball screw shaft 21 can be reduced by obviating a need for the LM guide, and a head section 100 further reduced in size can be provided. For example, the aforementioned dimension can be reduced by about 30 to 40 mm in comparison with that of the conventional head section.

Second Embodiment

The present invention is not limited to the aforementioned embodiment but is able to be provided in a variety of embodiments. For example, FIG. 8 shows a schematic sectional view of a head section 300 that is one example of a component placement head according to a second embodiment of the present invention.

Figure 8:
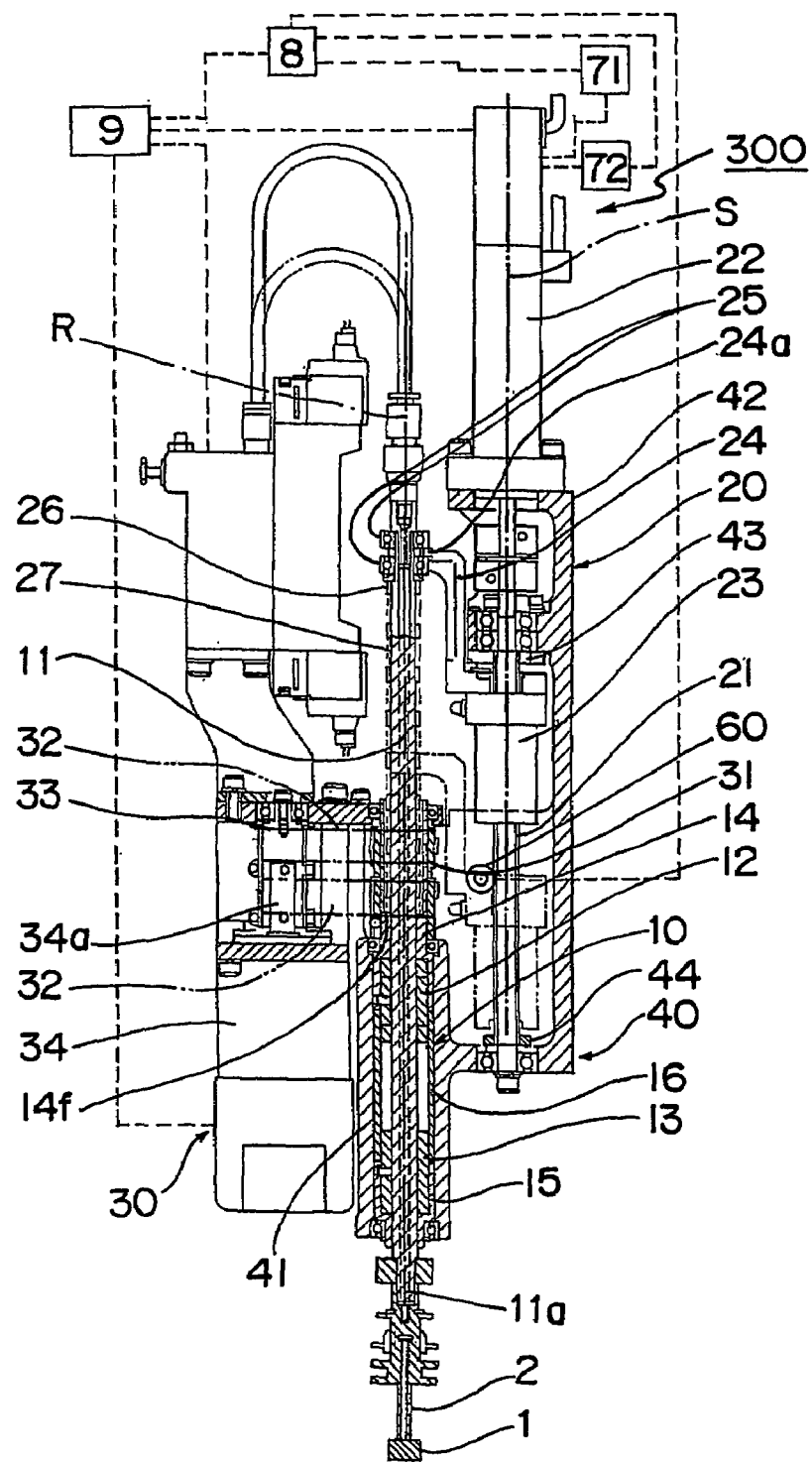
FIG. 8 is a schematic sectional view of a head section according to a second embodiment of the present invention.

As shown in FIG. 8, head section 300 basically has a structure similar to that of the head section 100 of the first embodiment shown in FIG. 1. Therefore, components having structures similar to those described above are denoted by the same reference numerals as in FIG. 1, and no description is provided therefor. Moreover, in a description of construction and functions of the head section 300, construction and functions of elevation unit 20 that has characteristic construction and actions in the present second embodiment will be described more in detail than in the first embodiment.

As shown in FIG. 8, in the elevation unit 20 of the head section 300, axis of rotation S of an axial center of ball screw shaft 21 is assumed as an elevating operational axis, and elevation nut section 23 is moved up and down along the elevating operational axis, and an elevating operational range is restricted between an upper end position and a lower end position. In concrete, the elevation nut section 23 can be moved up and down along axis of rotation S between an upper end side restriction frame 43, that is one example of a restricting portion fixed and attached to elevation frame 42 in an upper portion of the ball screw shaft 21 (below elevation drive motor 22), and a lower end side restriction frame 44 that is one example of a restricting portion fixed and attached to the elevation frame 42 in a lower portion of the ball screw shaft 21. Moreover, by bringing an upper end of the elevation nut section 23 being moved upward into contact with a lower end of the upper end side restriction frame 43, upward movement of the elevation nut section 23 is restricted in this position of contact. Moreover, by bringing a lower end of the elevation nut section 23 being moved downward into contact with an upper end of the lower end side restriction frame 44, downward movement of the elevation nut section 23 in this position of contact is restricted.

Moreover, each elevation unit 20 provided for the head section 300 is provided with an encoder 71 that is one example of a rotational angle detecting section capable of detecting a rotational angle around axis of rotation S of the elevation drive motor 22. In each elevation unit 20, the encoder 71 can detect a relative rotational angle with respect to an origin of rotation by setting one point of the rotational angle as the origin of rotation. Moreover, a variation of this rotational angle has a relation proportional to an amount of rotation of the ball screw shaft 21 and an amount of an elevating operation of the elevation nut section 23.

Further, each elevation unit 20 is provided with an overload detecting section 72 capable of detecting an overload of the elevation drive motor 22. In each elevation unit 20, the overload detecting section 72 can detect the overload of the elevation drive motor 22 when, for example, the upper end of the elevation nut section 23 comes into contact with the upper end side restriction frame 43, and this position of elevation is limited while the elevation drive motor 22 attempts to perform rotational driving.

(Light Transmission Unit)

In the head section 300 that has the above-mentioned construction, elevation units 20 move up and down suction nozzles 2 along axes of rotation R via respective spline shafts 11 in shaft sections 10, thereby performing a sucking and removal operation and a placement operation of electronic components 1. During these operations, it is important from which height position suction nozzle 2 is moved up and to which height position the suction nozzle 2 is moved down along axis of rotation R thereof. Therefore, each of the elevation units 20 that perform an elevating operation can execute an origin detecting operation (this origin detecting operation will be described later) for detecting an origin position that becomes a reference height position of the elevating operation. By executing the above-mentioned origin detecting operation periodically or arbitrarily in the head section 300, a reliable elevating operation of each of the suction nozzles 2 in the head section 300 is guaranteed.

The head section 300 is provided with a light transmission unit 60 that executes part of the above-mentioned origin detecting operation, and structure of this light transmission unit 60 will be described.

The light transmission unit 60 is provided with a light-projecting section 61 and a light-receiving section 62, which are arranged opposite to each other, in a direction along an array direction of the ball screw shafts 21, and the light-projecting section 61 and the light-receiving section 62 are attached and fixed to the elevation frame 42 so that the ball screw shafts 21 thereof are arranged between the light-projecting section 61 and the light-receiving section 62. FIGS. 9A through 9D are explanatory views schematically showing an origin detecting operation (method) in the head section 300. As shown in FIG. 9A, the light-projecting section 61 and the light-receiving section 62 are provided on the elevation frame 42 (not shown in FIGS. 9A through 9D) with relations of arrangement thereof maintained. Moreover, the light-projecting section 61 can irradiate light from a light-emitting section 61a, provided on a light-receiving section 62 side of the light-projecting section 61, toward the light-receiving section 62, while the light-receiving section 62 can receive and detect light emitted from the light-projecting section 61 in a light-detecting section 62a provided on a light-projecting section 61 side of the light-receiving section 62. Moreover, as shown in FIGS. 9A through 9D, an optical axis T is arranged between the light-emitting section 61a and the light-detecting section 62a so that light, which is emitted from the light-emitting section 61a and received and detected by the light-detecting section 62a, is roughly parallel to the array direction of the ball screw shafts 21 and roughly perpendicular to axis of rotation S of each of the ball screw shafts 21.

FIGS. 10A through 10C show schematic explanatory views of the elevation unit 20, viewed in a direction of arrow A in FIGS. 9A through 9D. As shown in FIG. 10A, optical axis T located between the light-detecting section 62a and the light-emitting section 61a (not shown in FIGS. 10A through 10C) in the light transmission unit 60 is arranged on the left-hand side in these figures without interfering with the ball screw shafts 21. Moreover, as shown in FIG. 10B or 10C, when the elevation nut section 23 is moved down along the ball screw shaft 21, a left-hand portion, in these figures, of the elevation nut section 23 can interfere with optical axis T.

With optical axis T thus arranged, when at least one elevation nut section 23, from among elevation nut sections 23 provided for the head section 300, is located in a position where this nut section interferes with optical axis T by performing an elevating operation thereof (e.g., in a state of FIG. 10B or 10C), light emitted from the light-projecting section 61 is interrupted by at least one elevation nut section 23 and not received by the light-receiving section 62. Conversely, when all the elevation nut sections 23 in the head section 300 are located in positions where the nut sections do not interfere with optical axis T by performing an elevating operation thereof (e.g., in a state of FIG. 10A), light emitted from the light-projecting section 61 is received by the light-receiving section 62 while being interrupted by none of the elevation nut sections 23.

Figure 11:
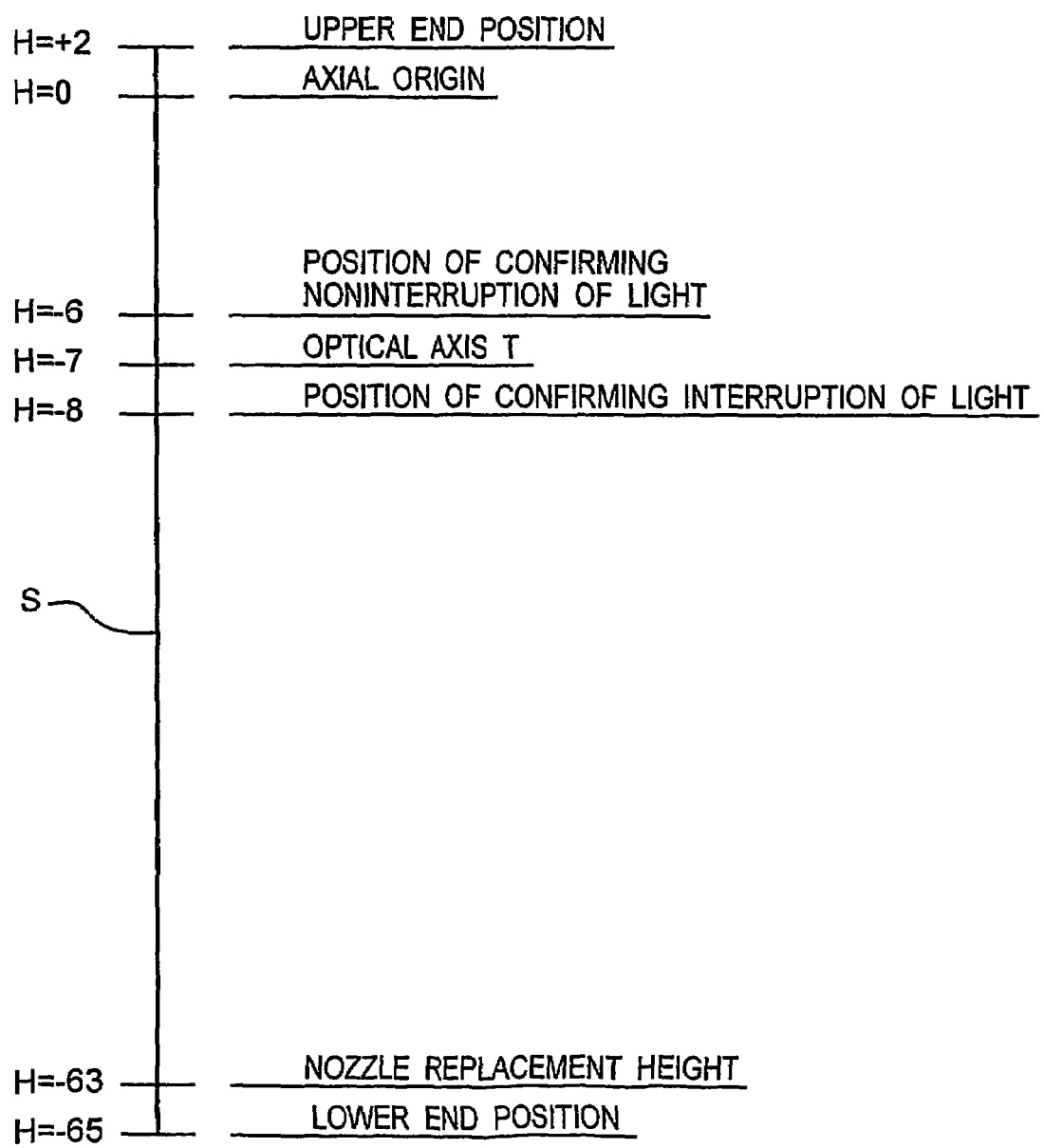
FIG. 11 is a schematic explanatory view showing a height position of elevation of each of the elevation nut sections in the head section of FIG. 8.

In this case, a height position along an elevating operational axis (also axis of rotation S) of the elevation nut section 23 in each of the elevation units 20 of the head section 300 will be described with reference to a schematic explanatory view shown in FIG. 11. It is to be noted that each of height positions shown in FIG. 11 is a position at a lower end of the elevation nut section 23. Since the elevation units 20 provided for the head section 300 perform similar elevating operations, one elevation unit 20 out of the elevation units 20 will be described with reference to FIG. 11.

As shown in FIG. 11, the elevation nut section 23 can move up and down between an upper end position of the elevating operation, at a height of H=+2 mm, and a lower end position of the elevating operation, at a height of H=−65 mm, with respect to an axial origin (H=0 mm) that is an origin of elevation served as a reference height position. Moreover, optical axis T of the light transmission unit 60 is located at a height of H=−7 mm. Optical axis T is arranged so that optical axis T does not interfere with the elevation nut section 23 in a state in which the lower end position of the elevation nut section 23 is located at a height of H=−6 mm, and optical axis T interferes with the elevation nut section 23 in a state in which the lower end position of the elevation nut section 23 is located at a height of H=−8 mm.

In the present specification, a "prescribed light interruption dimension" is assumed to mean a dimension (i.e., 7 mm) from the axial origin (H=0 mm) to the height position (H=−7 mm) where optical axis T is arranged. However, taking an arrangement error of the height position of optical axis T, a production error of the elevation nut section 23 and so on into consideration, it is preferable to set a prescribed light interruption dimension slightly greater than the aforementioned dimension so as to set the height position where interruption of light is reliably detected. In the present embodiment, the dimension is set within the height position of H=−8 mm (i.e., 8 mm).

Moreover, a height position relation of the elevation nut section 23 is synchronized with a height position relation of the spline shaft 11 and the suction nozzle 2 corresponding to this elevation nut section 23. For example, a height position of H=−63 mm is a nozzle replacement height of suction nozzle 2 equipped for nozzle attaching portion 11a of the spline shaft 11. By performing the elevating operation of the elevation nut section 23 mainly within a height position range of H=0 mm to H=−63 mm, a placement operation of the electronic component 1 is executed by corresponding suction nozzle 2.

In each of the elevation units 20, a variation in rotational angle of the elevation drive motor 22 detected by the encoder 71, and an amount of an elevating operation of the elevation nut section 23 are in a proportional relationship, and an origin of rotation of the rotational angle can be detected at a 12 mm pitch with respect to the position of H=0 mm served as a reference position. That is, the origin of rotation can be detected by the encoder 71 at each of the height positions of H=0, 12, 24, 36, 48 and 60 mm.

(Control Section)

Next, a control section for controlling operations in the head section 300 will be described next. As shown in FIG. 8, the head section 300 is provided with a control section 9 that controls a sucking and holding operation of electronic component 1 by each of the suction nozzles 2, an elevating operation in each of the elevation units 20 and a rotational operation in each of the rotating units 30. This control section 9 controls each of the suction nozzles 2, each of the elevation units 20 and each of the rotating units 30 so that operations thereof are related to one another, thereby enabling a placement operation of the electronic component 1 in the head section 300.

Moreover, the control section 9 is provided with an origin detection control section 8 that can control an origin detecting operation (method) for detecting an origin position of elevation of the elevation nut section 23 of each of the elevation units 20 in the head section 300. A detailed origin detecting operation in the origin detection control section 8 will be described later. Moreover, as shown in FIG. 8, this origin detection control section 8 can receive inputs of a detection's result (i.e., a rotational angle detection signal and an overload detection signal) from the encoder 71 and an overload detecting section 72 provided for each of the elevation units 20. Moreover, emission of light and presence or absence of interruption of light of emitted light in the light transmission unit 60 are inputted as detection signals to the origin detection control section 8, and the origin detection control section 8 can determine presence or absence of the interruption of light.

(Origin Detecting Operation)

Figure 12:
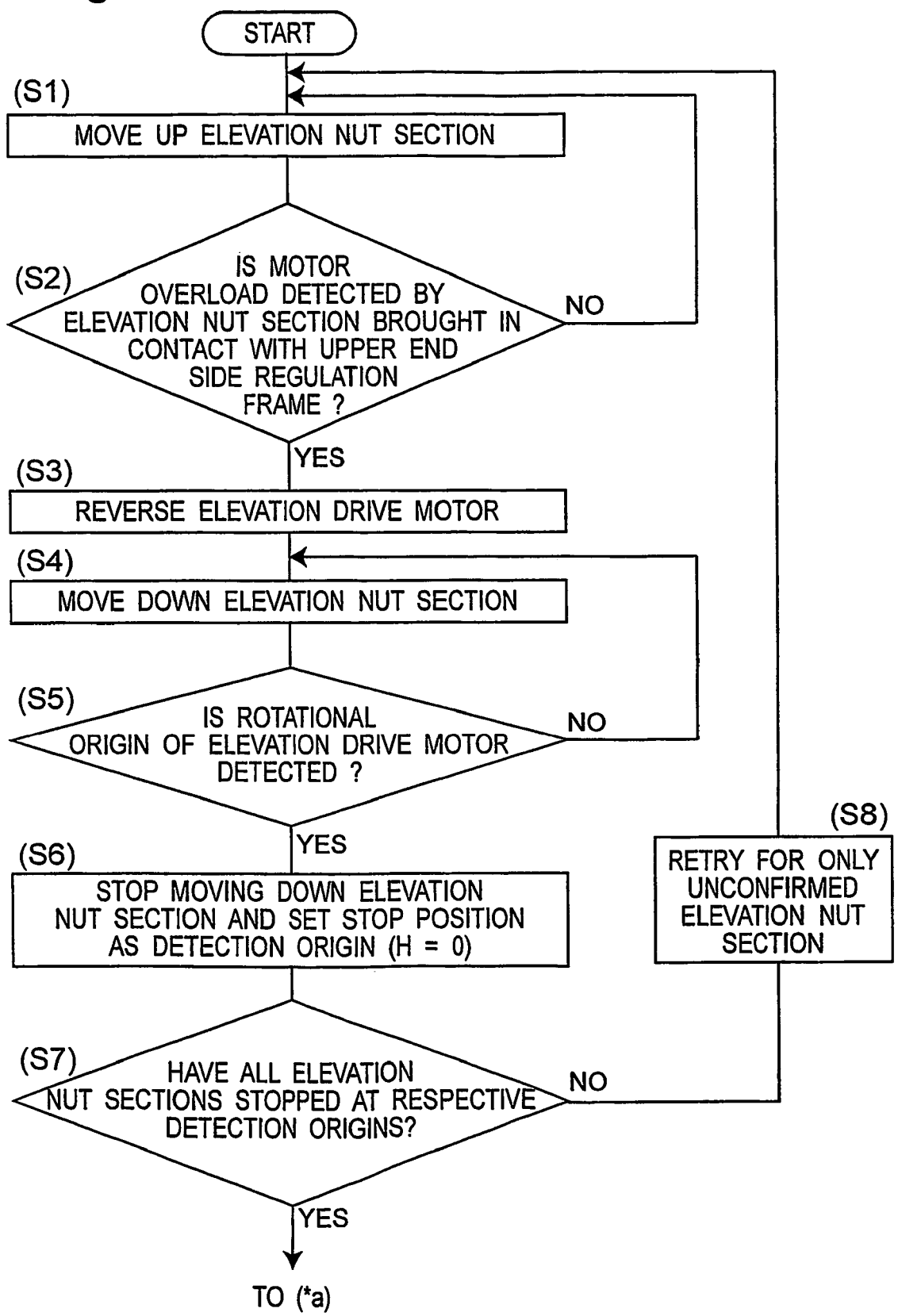
FIG. 12 is a flowchart showing a procedure of the origin detecting operation in the head section of FIG. 8.
Figure 13:
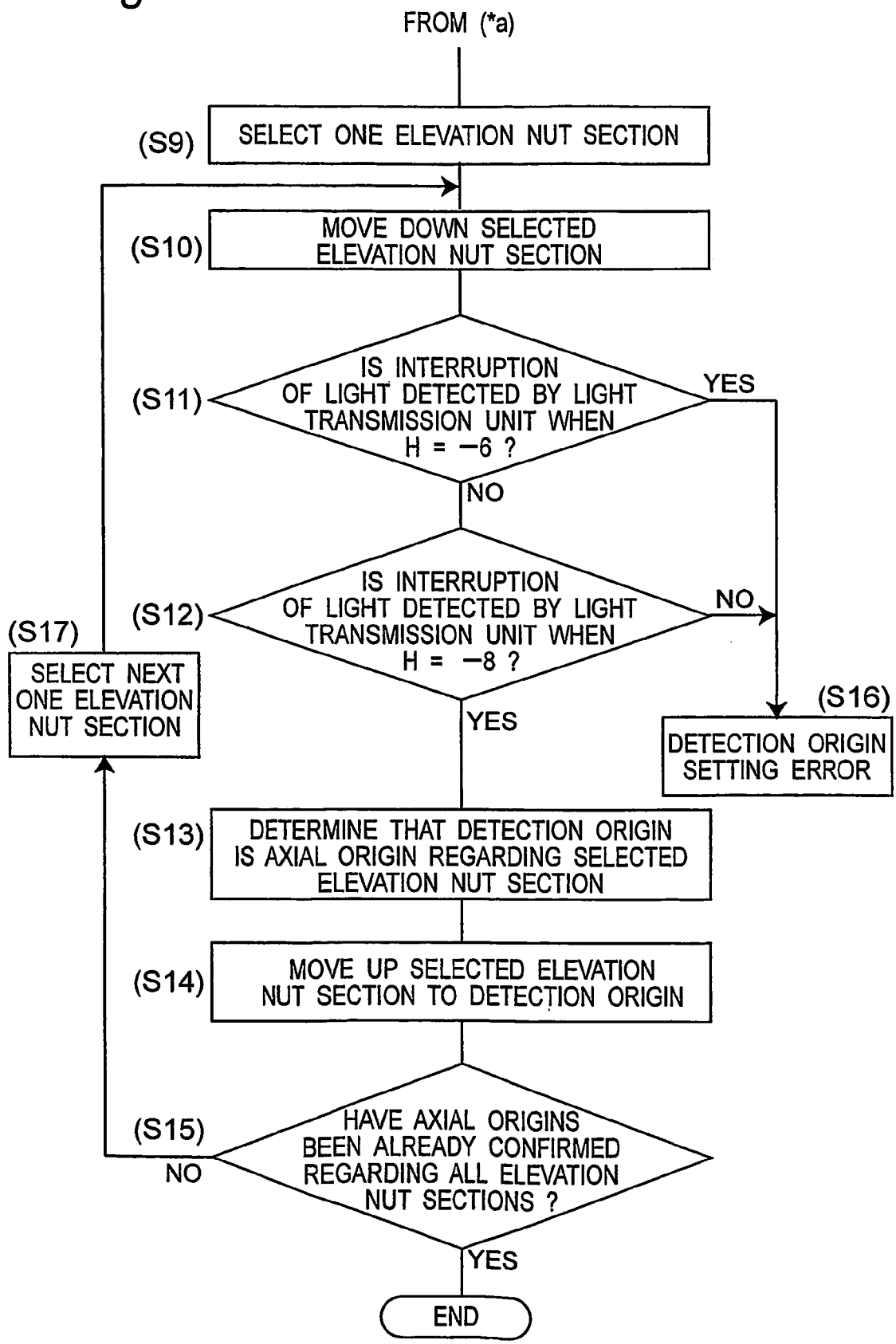
FIG. 13 is a flowchart showing a procedure of the origin detecting operation in the head section of FIG. 8.
Figure 14:
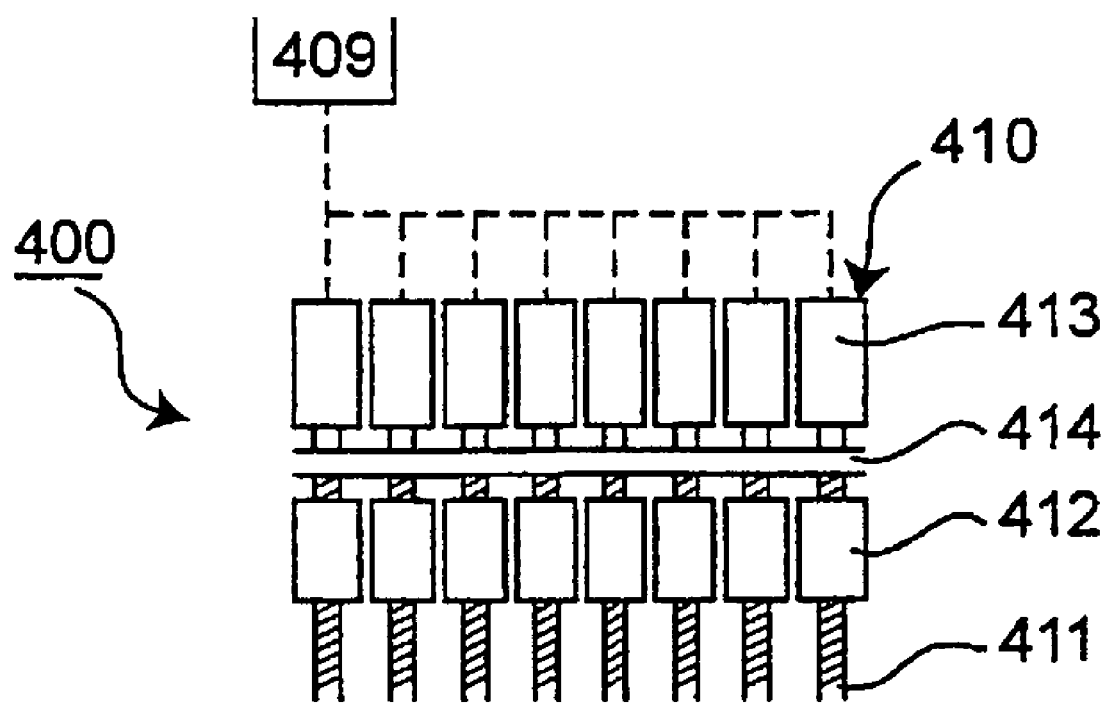
FIG. 14 is a schematic explanatory view showing an origin detecting operation in a conventional head section.

A method for detecting the origin of the elevating operation of the elevation nut section 23 in each of the elevation units 20 in the head section 300 that has the aforementioned construction and function will be described next. FIGS. 12 and 13 show a flowchart representing this origin detecting operation, and description is made on a basis of this flowchart. Each action of this origin detecting operation is controlled by the origin detection control section 8 of the control section 9.

First of all, as shown in FIG. 9A, in each of the elevation units 20, the elevation drive motor 22 is driven to rotate, thereby moving up the elevation nut section 23 located in an arbitrary height position on the elevating operational axis (step S1 in the flowchart of FIG. 12). This elevated elevation nut section 23 has its upper end brought into contact with the upper end side restriction frames 43, and this event of contact is determined by detecting an overload of the elevation drive motor 22 by the overload detecting section 72 and inputting this detection result to the origin detection control section 8 (step S2). It is to be noted that ascent of the elevation nut section 23 is effected until this overload detection is performed. Moreover, the height position where this overload detection is performed is a position of H=+2 mm in FIG. 11, and this state is a state shown in FIG. 9B. FIG. 9B shows a state in which contact is made only in the elevation nut section 23 located at the left-hand end in this figure.

When this overload is detected, a rotational direction of the elevation drive motor 22 is reversed (step S3). By this operation, the elevation nut section 23 is moved down along the elevating operation axis (step S4). During this descent, the origin of rotation of the elevation drive motor 22 is detected by the encoder 71, and the descent is effected until the origin of rotation is detected. When the origin of rotation is detected by the encoder 71 (step S5), rotational driving of the elevation drive motor 22 is stopped, and the descent of the elevation nut section 23 is stopped. Further, a stop position of the elevation nut section (position at the lower end) on this elevating operation axis is set as an origin of elevation (i.e., set as an origin presumed to be an axial origin (this is hereinafter assumed to be a detection origin)) in the origin detection control section 8, and setting is performed assuming that the elevation nut section 23 is located at the height position of H=0 mm in FIG. 11 (step S6).

Actions from step S1 to step S6 may be either in a case where the actions are executed concurrently in the elevation units 20 of the rotating unit 30, or in a case where the actions are executed sequentially. Subsequently, the detection origin is set in every elevation nut section 23 provided for the head section 300, and the origin detection control section 8 confirms a state of stoppage of the elevation nut sections 23 at these set detection origins (step S7). When there is an elevation nut section 23 that is not stopped at a detection origin with regard to the elevation nut sections 23, the actions from step S1 to step S6 are executed for the elevation nut section 23 (step S8). Moreover, a state in which all the elevation nut sections 23 provided for the head section 300 are stopped at respective detection origins is shown in FIGS. 9C and 10A.

After confirming in the origin detection control section 8 that all the elevation nut sections 23 are stopped at respective detection origins, one elevation nut section 23 is selected from among all the elevation nut sections 23 (step S9 in the flowchart of FIG. 13), and this selected elevation nut section 23 starts to move down from the detection origin (step S10). This descent is effected by detecting a rotational angle of the elevation drive motor 22 by the encoder 71 in a state in which a descent height position on the elevating operational axis is recognized by the origin detection control section 8.

Subsequently, when the origin detection control section 8 determines that the lower end of the selected elevation nut section 23 is moved down to the position of H=−6 mm in FIG. 11, the origin detection control section 8 detects presence or absence of interruption of light emitted from the light-projecting section 61 toward the light-receiving section 62 of the light transmission unit 60 (step S11). When interruption of light is not confirmed in step S11, the selected elevation nut section 23 is not stopped, and the descent is continuously effected. Subsequently, when it is determined that the lower end of the selected elevation nut section 23 is moved down to the position of H=−8 mm in FIG. 11, i.e., moved down by a light interruption prescribed dimension in the origin detection control section 8, the origin detection control section 8 detects presence or absence of interruption of light emitted from the light-projecting section 61 toward the light-receiving section 62 of the light transmission unit 60 (step S12). When interruption of light is confirmed in step S12, the origin detection control section 8 determines that the detection origin coincides with the axial origin with regard to the selected elevation nut section 23 (step S13). Irradiation of light by the light transmission unit 60 is only required to be effected at least in accordance with timing of step S11 and step S12, and this may be performed either in a case where the irradiation of light is continuously effected in advance, or in a case where the irradiation of light is intermittently effected in accordance with the above-mentioned timing. Moreover, a state of the elevation nut section 23 in step S12 is a state shown in FIGS. 9D and 10B. FIG. 9D shows a state in which the elevation nut section 23 located second from the left-hand side in this figure is moving down.

Moreover, when interruption of light is detected by the origin detection control section 8 in step S11, the lower end of the selected elevation nut section 23, which is estimated to be moved down to the position of H=−6 mm, is interfering with optical axis T of the light transmission unit 60 located at the position of H=−7 mm shown in FIG. 11. This is interpreted as an incorrect detection of the detection origin and as occurrence of a detection origin setting error (step S16).

Likewise, when interruption of light is not detected by the origin detection control section 8 in step S12, the lower end of the selected elevation nut section 23, which is estimated to be moved down to the position of H=−8 mm, is not interfering with optical axis T of the light transmission unit 60 located in the position of H=−7 mm shown in FIG. 11. This is interpreted as an incorrect detection of the detection origin and as occurrence of a detection origin setting error (step S16).

The selected elevation nut section 23, which has undergone confirmation of the detection origin in step S13 is moved up to the detection origin position (step S15), and a next elevation nut section 23, which has not yet been selected, is selected from among the elevation nut sections 23 provided for the head section 300 (step S17). Subsequently, the procedure from step S10 to step S14 is similarly executed for this selected elevation nut section 23. In step S15, when the origin detection control section 8 determines that coincidence of detection origins of all the elevation nut sections 23 provided for the head section 300 with axial origins has been confirmed, this origin detecting operation is completed.

In the above description, the origin detecting operation is executed for all the elevation nut sections 23 provided for the head section 300. However, the origin detecting operation is not limited only to the above-mentioned case, and there may be a case where the origin detecting operation is executed for only one elevation nut section 23. In such a case, if it is confirmed in step S15 that confirmation of an axial origin has been executed for the elevation nut section 23 to be subjected to origin detection, then the origin detecting operation ends.

Moreover, in the flowchart of the origin detecting operation shown in FIGS. 12 and 13, a series of operations from step S1 to step S8 is one example of an origin setting means (or origin setting process), and a series of operations from step S9 to step S17 is one example of an origin confirming means (or origin confirming process).

Although the aforementioned origin detecting operation has been executed by concurrently using the encoder 71 and the overload detecting section 72 provided for each of the elevation units 20 for the setting of detection origins according to the above description, the second embodiment is not limited to this case. For example, in place of the above-mentioned case, the overload detecting section 72 may not be provided since setting of the origin detection can be performed when a position of elevation on the elevating operational axis of the elevation nut section 23 can be detected only by detection of a rotational angle of the elevation drive motor 22 by the encoder 71.

Moreover, in the present second embodiment, the origin detecting operation is executed by detecting that light emitted from the light transmission unit 60 is interrupted directly by each of the elevation nut sections 23. Each of the elevation nut sections 23 is formed with a production dimension accuracy of, for example, about ±0.05 mm, by which origin detection accuracy of an origin detecting operation can be within a range of about ±0.2 mm, and this allows reliable accurate origin detection to be achieved.

(Suction Nozzle Interference Prevention Interlock)

Interference prevention interlock of the suction nozzles 2 utilizing the light transmission unit 60 provided for the aforementioned head section 300 will be described next.

As shown in FIGS. 8 and 11, each of the elevation nut sections 23 provided for the head section 300 has its elevating operation upper end position mechanically restricted by the upper end side restriction frame 43, and has its lower end position mechanically restricted by the lower end side restriction frame 44. As shown in FIG. 11, with regard to each of the elevation nut sections 23, its height position along the elevating operational axis (i.e., axis of rotation S) is elevatable within a range in which H=+2 mm to −65 mm. Moreover, optical axis T of the light transmission unit 60 has its height position set at H=−7 mm, and interruption of light is detected when arbitrary portions of the elevation nut section 23, including its lower portion, is located at the height position of H=−7 mm.

When the elevation height position of each of the elevation nut sections 23 is located on a lower side of the position of H=−7 mm, interruption of light can surely be detected by the light transmission unit 60 by using a function of the aforementioned light transmission unit 60. In concrete, each of the elevation nut sections 23 is formed so that the upper portion of each of the elevation nut sections 23 interferes with optical axis T located in the position of H=−7 mm in a state in which each of the elevation nut sections 23 is located in an elevating operation lower end position (H=−65 mm). With this arrangement, when each of the elevation nut sections 23 is consistently interfering with optical axis T of the light transmission unit 60 when located below the position of H=−7 mm, interference of light is to be detected.

By thus forming each of the elevation nut sections 23, when one elevation nut section 23 from among the elevation nut sections 23 provided for the head section 300 is located below the position of H=−7 mm, i.e., when the suction nozzle 2 corresponding to the elevation nut section 23 is located in a height position below the position of H=−7 mm, interference of light is surely detected by the light transmission unit 60. By inputting this detection result to the control section 9 via the origin detection control section 8, the control section 9 inhibits movement of the main body of the head section 300 along a surface of the circuit board (i.e., movement performed by the X-Y robot provided for the electronic component placing apparatus), thereby enabling prevention of interference of the suction nozzle 2 located in the aforementioned lower height position with constituent members of the electronic component placement apparatus, such as electronic components 1 and the like mounted on the circuit board. That is, detection of light by the light transmission unit 60 can be the interference prevention interlock of the suction nozzles 2 in the head section 300.

(Effects of the Second Embodiment)

According to the second embodiment, the following various effects can be obtained.

First of all, instead of performing a mounting operation of the electronic components 1, by executing an elevating-operation of each of the suction nozzles 2 in the head section 300 using this detection origin as it is after the detection origin of elevation of each of the elevation nut sections 23 is set by detecting the origin of rotation of each of the elevation drive motors 22 by use of each of the encoders 71 provided for the head section 300, it is confirmed whether or not these set detection origins actually coincide with axial origins. Therefore, even if a malfunction (setting error) occurs during setting of each of the detection origins, the setting error can reliably be detected, and a possible occurrence of a placement error due to the fact that the detection origin does not coincide with the axial origin can be prevented in advance in a subsequent placement operation of the electronic components 1, and reliable origin detection can be achieved. This allows an electronic component placement operation to be achieved with high accuracy in the component placement apparatus provided with the aforementioned head section 300.

Moreover, the aforementioned origin detection can be achieved by providing the head section 300 with only one light transmission unit 60, which is provided with the light-projecting section 61 and the light-receiving section 62 arranged opposite to each other along the array direction of the ball screw shafts 21, thereby allowing the elevation nut sections 23 to be arranged between the light-projecting section 61 and the light-receiving section 62, and detecting presence or absence of interruption of light by the elevation nut section 23 by receiving light emitted from the light-projecting section 61 toward the light-receiving section 62 by the light-receiving section 62.

That is, by operation that interruption of light is not detected, by the light transmission unit 60, in which a height position of optical axis T of emission of light thereof is set to H=−7 mm, when one elevation nut section 23 is selected from among the elevation nut sections 23 in a state in which they are located in respective set detection origin positions, this selected elevation nut section 23 is moved down with respect to the set detection origin as a reference, and the lower end of the selected elevation nut section 23 is moved down to the height position of H=−6 mm. And, upon operation that interruption of light is detected by the light transmission unit 60 when the lower end is moved down to the height position of H=−8 mm, the origin detection control section 8 determines that the set detection origin coincides with the axial origin of this elevation nut section 23, thereby allowing the origin detection to be achieved. Moreover, for the other elevation nut sections 23, the origin detection can be achieved by confirming that the set detection origins coincide with respective axial origins according to a similar procedure through successive selection.

Therefore, even when a plurality of, for example, eight suction nozzles 2 are provided as in the head section 300, confirmation of the origin can be achieved by providing one light transmission unit 60 for the head section 300 without providing each of the elevation units 20 with a unit for origin confirmation. Therefore, a head section capable of executing reliable origin detection can be provided with a simple construction, and production cost thereof can be suppressed.

Moreover, the light transmission unit 60 can detect whether or not light emitted from the light-projecting section 61 is directly interrupted by elevation nut section 23. Construction of the head section can be made simple without providing a special light shield plate (e.g., DOG etc.) for interruption of the light, and this can contribute to downsizing of the head section.

Moreover, by providing each of the elevation units 20 of the head section 300 with the overload detecting section 72 in addition to the encoder 71, it is determined that the elevation nut section 23 has been moved up and the elevation nut section 23 has come into contact with the upper end side restriction frame 43 by detection of an overload of the elevation drive motor 22 by the overload detecting section 72 during setting of the detection origin of each of the elevation nut sections 23. When this detection is performed, the elevation drive motor 22 is reversed to move down the elevation nut section 23, and after initiation of this descent, a lowered position of the elevation nut section 23, when an origin of rotation of the elevation drive motor 22 detected first by the encoder 71 is detected, can be set as the detection origin position. With this arrangement, setting of the detection origin can be achieved with a simple construction of the encoder 71 and the overload detecting section 72, thereby providing neither with a complicated mechanism nor unit for this detection origin setting for the head section 300.

Moreover, in a case where each of the elevation nut sections 23 provided for the head section 300 has its elevation height position located on the lower side of the position of H=−7 mm, when one elevation nut section 23 from among the elevation nut sections 23 is located in the position of H=−7 mm, i.e., when the suction nozzle 2 corresponding to the elevation nut section 23 is located in the height position lower than the position of H=−7 mm with a formation such that interruption of light is surely detected by the light transmission unit 60, this interruption of light can surely be detected by the light transmission unit 60. By inputting this detection result to the control section 9 via the origin detection control section 8, the control section 9 inhibits movement of a main body of the head section 300 along a surface of a circuit board (i.e., movement performed by the X-Y robot provided for the electronic component placement apparatus), thereby enabling prevention of interference of the suction nozzle 2 located in the aforementioned lower height position with constituent members of the electronic component placement apparatus, such as the electronic components 1 and the like mounted on the circuit board. That is, detection of light by the light transmission unit 60 can further be the interference prevention interlock of the suction nozzles 2 in the head section 300, and this can obviate a need for providing a special sensor or the like for provision of an interlock like this in the head section 300, thereby allowing construction of the head section to be simple.

It is to be noted that, by appropriately combining arbitrary embodiments of the aforementioned embodiments, effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. An origin detection method for a component placement head including
   (i) linearly arranged shaft sections, each of said shaft sections having an end portion provided with a component holding member for releasably holding a component to be placed onto a circuit board,
   (ii) elevation units corresponding one to one with said shaft sections, each of said elevation units for moving up and down a corresponding one of said shaft sections along an axis of rotation of said corresponding one of said shaft sections, said each of said elevation units being comprised of
      (a) a ball screw shaft section rotatably supported about an axis of rotation of said ball screw shaft section,
      (b) a drive section, fixed to an end portion of said ball screw shaft section, for rotating said ball screw shaft section about said axis of rotation of said ball screw shaft section,
      (c) an elevation nut section meshed with said ball screw shaft section and being elevatable along said axis of rotation of said ball screw shaft section via rotation of said ball screw shaft section, and
      (d) an engagement member fixed to said elevation nut section and engaged with said corresponding one of said shaft sections, said engagement member being able to move said corresponding one of said shaft sections up and down in synchronization with ascent and descent of said elevation nut section; and
   (iii) a light-projecting section and a light-receiving section arranged opposite to each other along an array direction of the ball screw shaft sections such that said elevation nut section of said each of said elevation units is capable of being positioned between said light-projecting section and said light-receiving section, whereby, when said elevation nut section of said each of said elevation units is not positioned between said light-projecting section and said light-receiving section, light emitted by said light-projecting section is not interrupted by said elevation nut section and is received by said light-receiving section, and when said elevation nut section of said each of said elevation units is positioned between said light-projecting section and said light-receiving section, light emitted by said light-projecting section is interrupted by said elevation nut section and is not received by said light-receiving section, said method comprising:

setting an axial origin for each said elevation nut section by detecting a rotational angle of a corresponding said drive section;

individually moving down said each said elevation nut section from a respective said axial origin so that light emitted from said light-projecting section is received by said light-receiving section without being interrupted; and confirming that each said respective said axial origin is an origin of elevation by detecting interruption of light, emitted from said light-projecting section, by a corresponding said each said elevation nut section at a position corresponding to said corresponding said each said elevation nut section having been lowered from said each said respective axial origin by a prescribed light interruption dimension.

2. The method according to claim 1, further comprising:

prior to setting an axial origin for each said elevation nut section,
   (i) elevating said each said elevation nut section to an upper end position by rotating a corresponding said drive section; and then
   (ii) when an overload of each said corresponding said drive section is detected at a corresponding said upper end position, reversing a rotational direction of said corresponding said drive section, wherein detecting a rotational angle of a corresponding said drive section comprises detecting said rotational angle after reversing the rotational direction of said corresponding said drive section such that a position along an axis of rotation of said each said elevation nut section is set as said axial origin.

3. The method according to claim 1, wherein
said light-projecting section and said light-receiving section are arranged so that light emitted from said light-projecting section cannot be received by said light-receiving section when any said each said elevation nut section has been lowered from a corresponding said origin of elevation by said prescribed light interruption dimension.

4. The method according to claim 1, wherein said each said elevation nut section can consistently interrupt light emitted from said light-projecting section when said elevation nut section is located between a first position, corresponding to said elevation nut section having been lowered from a corresponding said origin of elevation by said prescribed light interruption dimension, and a second position, corresponding to a lower end position of elevation of said elevation nut section, said method further comprising:

in a state in which light emitted from said light-projecting section is interrupted, inhibiting movement of each said component holding member in a direction along a surface of the circuit board.

* * * * *